(12) United States Patent
Kang

(10) Patent No.: US 10,763,309 B2
(45) Date of Patent: Sep. 1, 2020

(54) DISPLAY DEVICE

(71) Applicant: LG Display Co., Ltd., Seoul (KR)

(72) Inventor: Seogshin Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/546,743

(22) Filed: Aug. 21, 2019

(65) Prior Publication Data

US 2020/0212121 A1  Jul. 2, 2020

(30) Foreign Application Priority Data

Dec. 28, 2018 (KR) .......................... 10-2018-0173126

(51) Int. Cl.
*H01L 27/32* (2006.01)
*H01L 27/12* (2006.01)

(52) U.S. Cl.
CPC ...... *H01L 27/3211* (2013.01); *H01L 27/3209* (2013.01); *H01L 27/3262* (2013.01); *H01L 27/3279* (2013.01); *H01L 27/1214* (2013.01); *H01L 27/322* (2013.01); *H01L 27/3272* (2013.01); *H01L 2227/323* (2013.01)

(58) Field of Classification Search
CPC ............. H01L 27/3211; H01L 27/3209; H01L 27/3262; H01L 27/3279; H01L 27/1214; H01L 27/322; H01L 27/3272; H01L 2227/323; G09G 2300/0452
See application file for complete search history.

(56) References Cited

U.S. PATENT DOCUMENTS

2004/0036421 A1* 2/2004 Arnold ................. G09G 3/3216
315/169.3
2017/0352709 A1 12/2017 Hack et al.

FOREIGN PATENT DOCUMENTS

KR    10-2017-0137577 A    12/2017

* cited by examiner

*Primary Examiner* — Feifei Yeung Lopez
(74) *Attorney, Agent, or Firm* — Birch, Stewart, Kolasch & Birch, LLP

(57) ABSTRACT

A display device can include a first subpixel and a second subpixel disposed on a substrate; a first electrode disposed in each of the first subpixel and the second subpixel; a first light emitting layer disposed on the first electrode, the first light emitting layer being configured to emit light of a first color; a second electrode disposed on the first light emitting layer; a second light emitting layer disposed on the second electrode, the second light emitting layer being configured to emit light of a second color; and a third electrode disposed on the second light emitting layer, in which the first light emitting layer and the second electrode are both included in the first subpixel, and the first light emitting layer and the second electrode are both absent from the second subpixel.

21 Claims, 27 Drawing Sheets

DISPLAY DEVICE

CROSS-REFERENCE TO RELATED APPLICATIONS

This application claims the benefit of the Korean Patent Application No. 10-2018-0173126, filed on Dec. 28, 2018, which is hereby incorporated by reference as if fully set forth herein.

BACKGROUND

Field of the Disclosure

The present disclosure relates to a display device that displays an image.

Discussion of the Related Art

With advancement in information-oriented societies, requirements for display devices displaying an image have increased in various types. Recently, various display devices such as a liquid crystal display (LCD) device, a plasma display panel (PDP) device, and an organic light emitting display (OLED) device have been widely utilized.

Head-mounted displays (HMD) including such a display device have been developed recently. A head-mounted display (HMD) is an eyeglass type monitoring device for virtual reality (VR) or augmented reality (AR) which is worn in the form of eyeglasses or a helmet and in which a focus is formed at a position close to a user's eyes.

In such a head-mounted display, it is difficult to precisely form light emitting layers of different colors by subpixels due to small pixel intervals for a high resolution. In this regard, a head-mounted display can realize different colors by forming a white light emitting layer as a common layer, which includes a plurality of stacks emitting light of different colors, and disposing color filters by subpixels. In this situation, a head-mounted display has advantages that it is not necessary to manufacture a precise mask or to perform a precise mask alignment process, but has problems in that power consumption is great due to a plurality of stacks.

SUMMARY

An aspect of the present disclosure is directed to a display device that can reduce power consumption.

According to an embodiment of the present disclosure, there is provided a display device including: a substrate that includes a first subpixel and a second subpixel; a first electrode that is provided in each of the first subpixel and the second subpixel on the substrate; a first light emitting layer that is provided on the first electrode and emits light of a first color; a second electrode that is provided on the first light emitting layer; a second light emitting layer that is provided on the second electrode and emits light of a second color; and a third electrode that is provided on the second light emitting layer. The first light emitting layer and the second electrode are provided in only the first subpixel out of the first subpixel and the second subpixel.

According to another embodiment of the present disclosure, there is provided a display device including: a substrate that includes a first subpixel, a second subpixel, and a third subpixel; a first electrode that is provided in each of the first subpixel, the second subpixel, and the third subpixel on the substrate; a first light emitting layer that is provided on the first electrode and emits light of a first color; a second electrode that is provided on the first light emitting layer; a second light emitting layer that is provided on the second electrode and emits light of a second color; and a third electrode that is provided on the second light emitting layer. The first light emitting layer and the second electrode are provided in only the first subpixel and the third subpixel out of the first subpixel, the second subpixel, and the third subpixel.

According to the present disclosure, the first light emitting layer and the second light emitting layer are provided in the subpixels without using a mask and, particularly, the second light emitting layer is provided on the entire surface of the subpixels. Accordingly, according to the present disclosure, it is possible to solve problems due to formation of different light emitting layers in patterns by subpixels using a mask. That is, it is not necessary to manufacture a precise mask nor perform a precise mask alignment process, and the present disclosure can be applied to a display device with high resolution having small pixel intervals.

According to the present disclosure, the first light emitting layer and the second light emitting layer are provided in a single subpixel and only one of the first light emitting layer and the second light emitting layer can be made to emit light. Accordingly, according to the present disclosure, it is possible to markedly reduce power consumption in comparison with a situation in which both the first light emitting layer and the second light emitting layer are made to emit light.

According to the present disclosure, by employing the screen pattern, the second electrode is cut off between the subpixels, and the second electrode of each subpixel can be easily connected to one of the first power supply line and the second power supply line. According to the present disclosure, it is not necessary to manufacture a separate mask, and since the screen pattern is formed at the same time as the first electrode, a particularly process is not added.

Advantageous effects of the present disclosure are not limited to the above-mentioned advantageous effects and other advantageous effects which have not been mentioned above will be apparently understood by those skilled in the art from the following description.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE EMBODIMENTS

Figure 1:
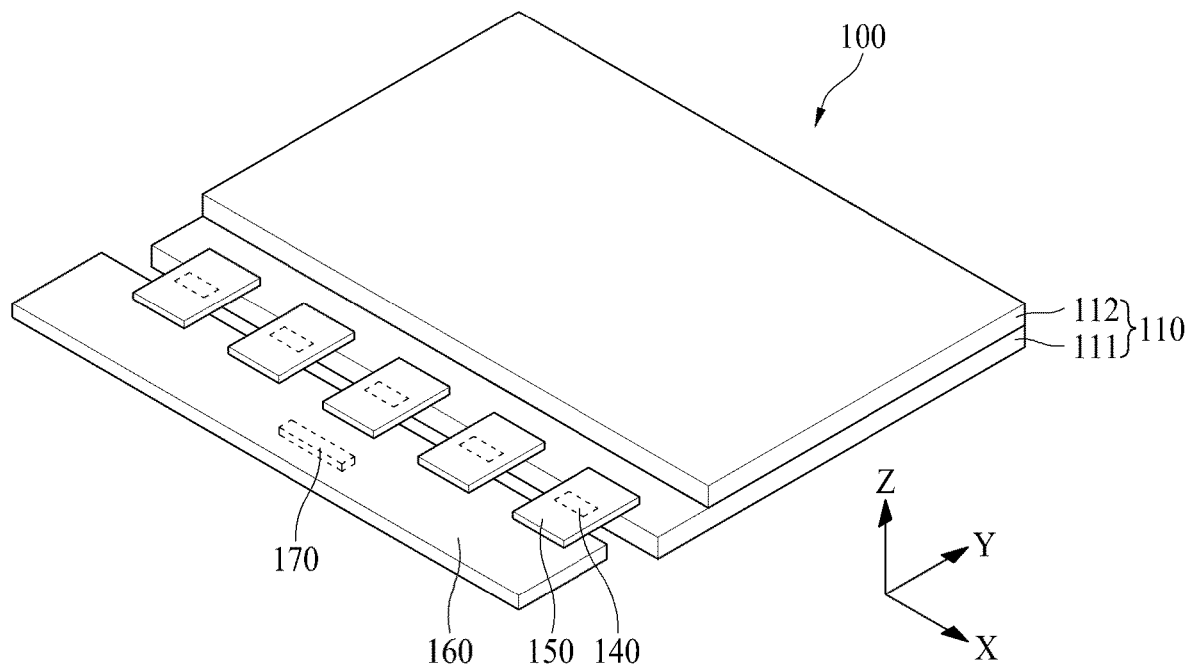
FIG. 1 is a perspective view illustrating a display device according to an embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a situation where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a positional relationship, for example, when a position relation between two parts is described as "on," "over," "under," and "next," one or more other parts may be disposed between the two parts unless 'just' or 'direct' is used.

In describing a temporal relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An "X-axis direction," a "Y-axis direction," and a "Z-axis direction" should not be construed as a geometric relationship in which they are perpendicular to each other and mean that they have broad directivity within the scope in which elements of the present disclosure work functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
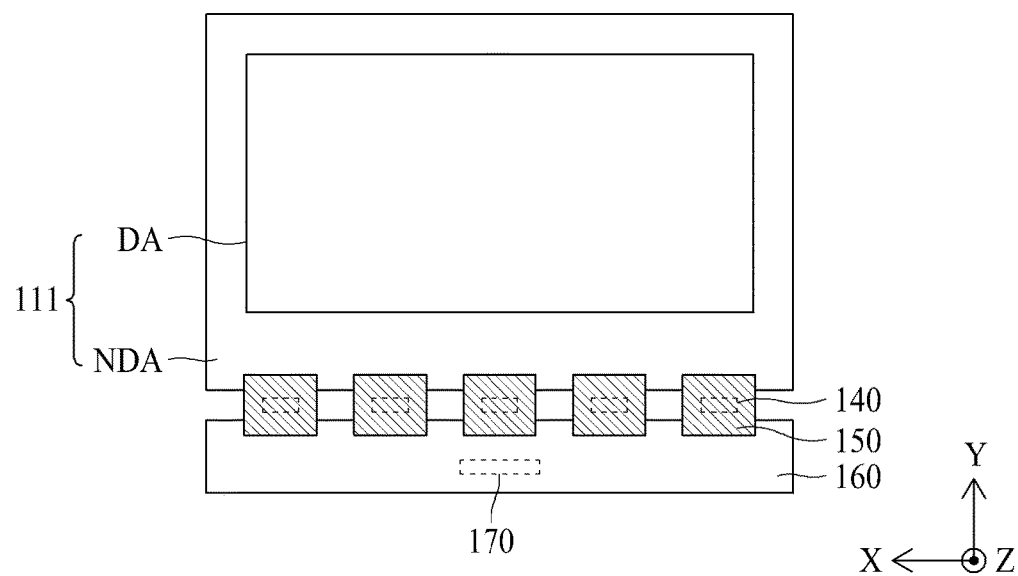
FIG. 2 is a plan view illustrating a first substrate, a source drive IC, a flexible film, a circuit board, and a timing control unit illustrated in FIG. 1 according to an embodiment of the present disclosure.

FIG. 1 is a perspective view illustrating a display device according to an embodiment of the present disclosure. FIG. 2 is a plan view illustrating a first substrate, a source drive IC, a flexible film, a circuit board, and a timing control unit illustrated in FIG. 1.

Referring to FIGS. 1 and 2, a display device 100 according to an embodiment of the present disclosure includes a display panel 110, a source drive integrated circuit (hereinafter referred to as "IC") 140, a flexible film 150, a circuit board 160, and a timing control unit 170.

The display panel 110 includes a first substrate 111 and a second substrate 112. The second substrate 112 can be an encapsulation substrate. The first substrate 111 can be a plastic film, a glass substrate, or a silicon wafer substrate which is formed using a semiconductor process. The second substrate 112 can be a plastic film, a glass substrate, or an encapsulation film.

Gate lines, data lines, and subpixels are provided on one surface of the first substrate 111 facing the second substrate 112. The subpixels are provided in areas which are defined by intersection structures of the gate lines and the data lines.

Each of the subpixels includes a thin-film transistor and a light emitting element including an anode electrode, a light emitting layer, and a cathode electrode. Each subpixel supplies a predetermined current to the light emitting element based on a data voltage of the corresponding data line when a gate signal is input from the corresponding gate line using the thin-film transistor. Accordingly, when a high-potential voltage is supplied to the anode electrode and a low-potential voltage is supplied to the cathode electrode, the light emitting layer of each subpixel emits light with predetermined brightness based on the predetermined current.

The display panel 110 is partitioned into a display area DA in which the subpixels are provided and which displays an image and a non-display area NDA which does not display an image. The gate lines, the data lines, and the subpixels are provided in the display area DA. A gate driving unit and pads are provided in the non-display area NDA.

The gate driving unit supplies gate signals to the gate lines in accordance with a gate control signal which is input from the timing control unit 170. The gate driving unit can be provided in a gate in panel (GIP) system in the non-display area NDA outside one side or both sides of the display area DA of the display panel 110. Alternatively, the gate driving unit can be manufactured as a drive chip, be mounted on a flexible film, and be attached in a tape automated bonding (TAB) system to the non-display area NDA outside one side or both sides of the display area DA of the display panel 110.

The source drive IC 140 is supplied with digital video data and a source control signal from the timing control unit 170. The source drive IC 140 converts digital video data into analog data voltages in accordance with the source control signal and supplies the analog data voltages to the data lines. When the source drive IC 140 is manufactured as a drive chip, the source drive IC 140 can be mounted on the flexible film 10 in a chip on film (COF) system.

Pads such as data pads are provided in the non-display area NDA of the display panel 110. Wires connecting the pads to the source drive IC 140 and wires connecting the pads to wires of the circuit board 160 are provided in the flexible film 150. The flexible film 150 is attached onto the pads using an anisotropic conducting film and thus the pads are connected to the wires of the flexible film 150.

The circuit board 160 is attached to the flexible film 150. A plurality of circuits including drive chips are mounted on the circuit board 160. For example, the timing control unit 170 can be mounted on the circuit board 160. The circuit board 160 can be a printed circuit board or a flexible printed circuit board.

The timing control unit 170 is supplied with digital video data and a timing signal from an external system board via a cable of the circuit board 160. The timing control unit 170 generates a gate control signal for controlling an operation timing of the gate driving unit and a source control signal for controlling the source drive IC 140 on the basis of the timing signal. The timing control unit 170 supplies the gate control signal to the gate driving unit and supplies the source control signal to the source drive IC 140.

Figure 3:
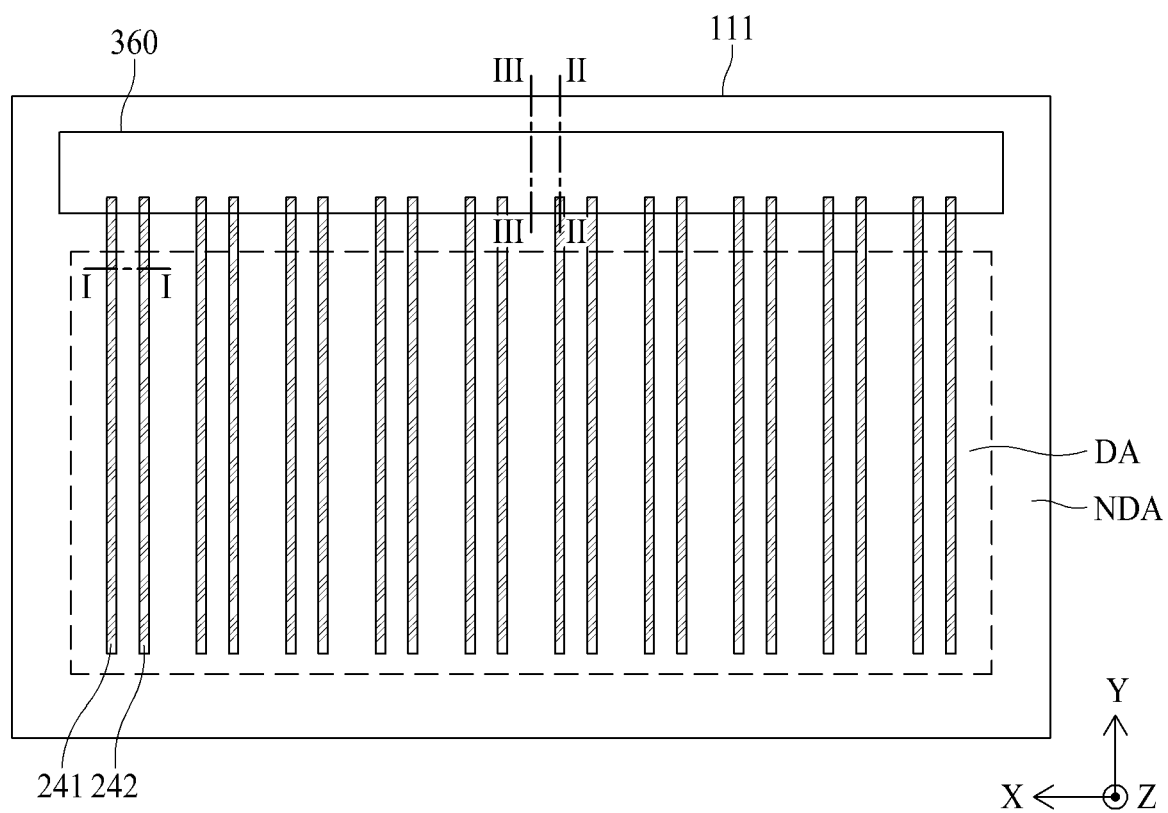
FIG. 3 is a plan view schematically illustrating a first substrate of a display panel according to an embodiment of the present disclosure.
Figure 4:
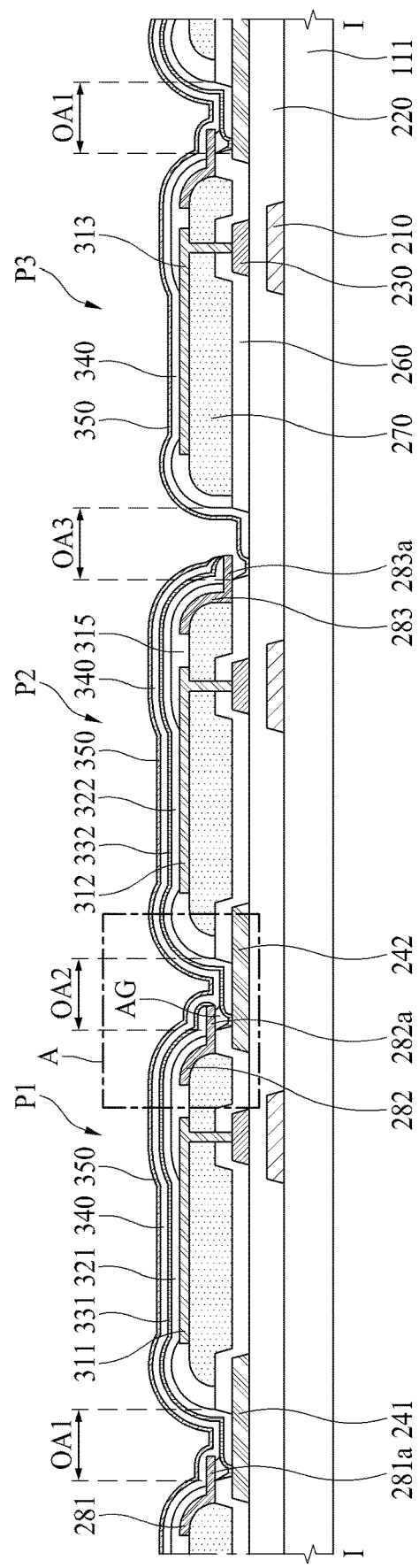
FIG. 4 is a sectional view taken along line I-I in FIG. 3 according to an embodiment of the present disclosure.
Figure 5:
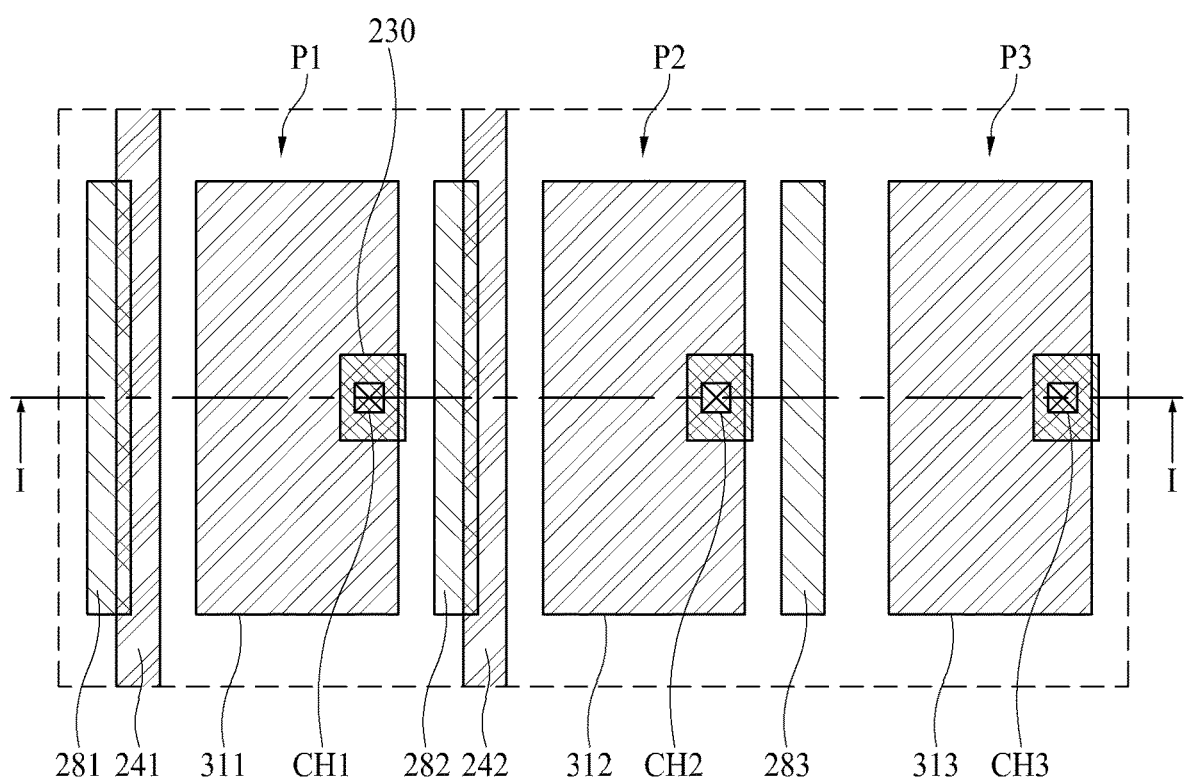
FIG. 5 is a plan view schematically illustrating an example of a first subpixel, a second subpixel, and a third subpixel according to an embodiment of the present disclosure.
Figure 6:
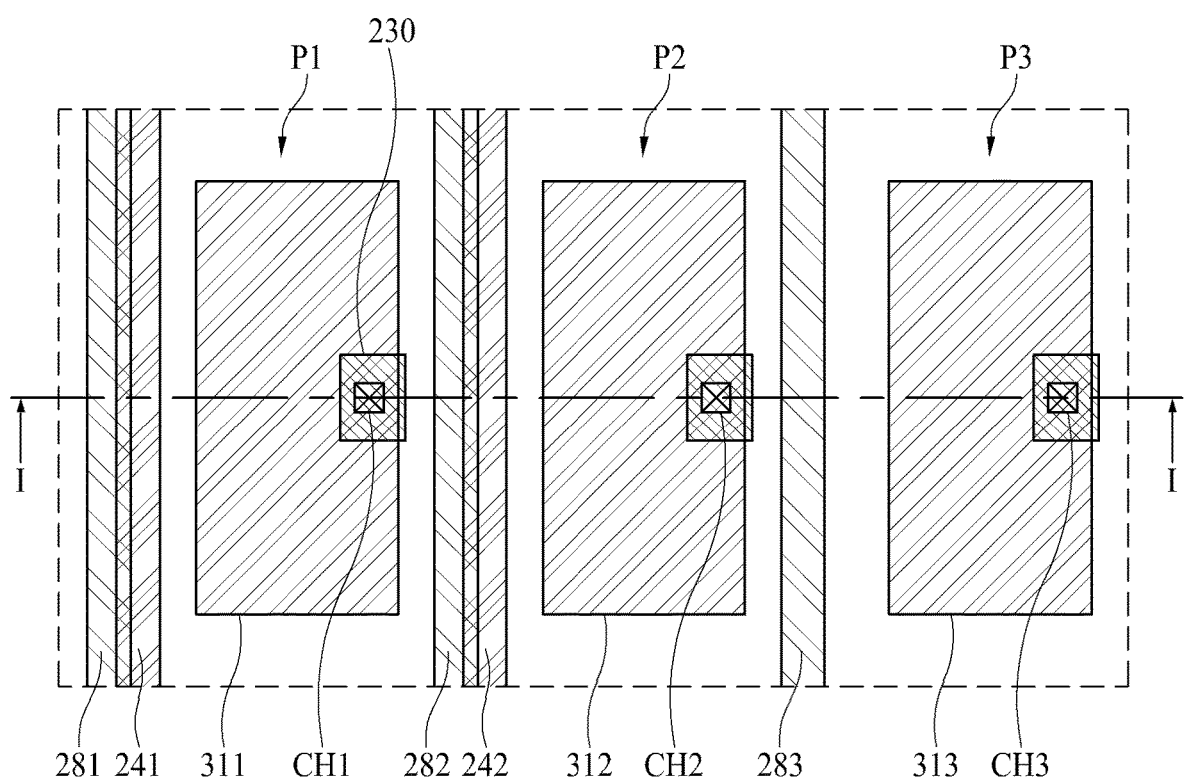
FIG. 6 is a plan view illustrating a modified example of FIG. 5 according to an embodiment of the present disclosure.
Figure 7:
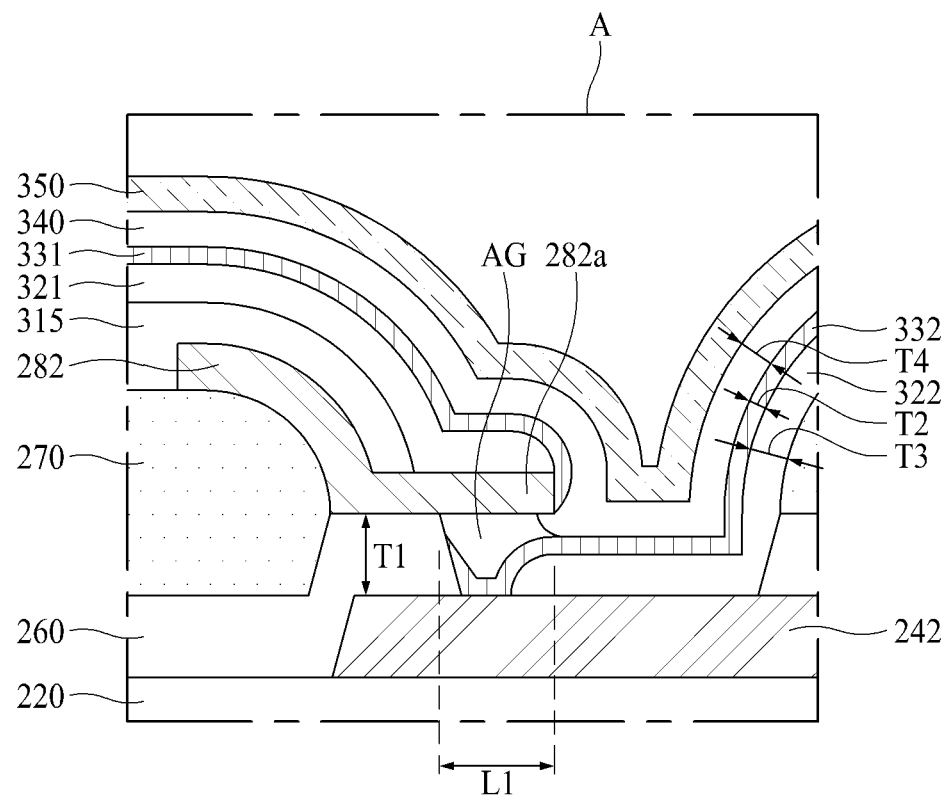
FIG. 7 is an enlarged view illustrating an example of Area A in FIG. 4 according to an embodiment of the present disclosure.
Figure 8:
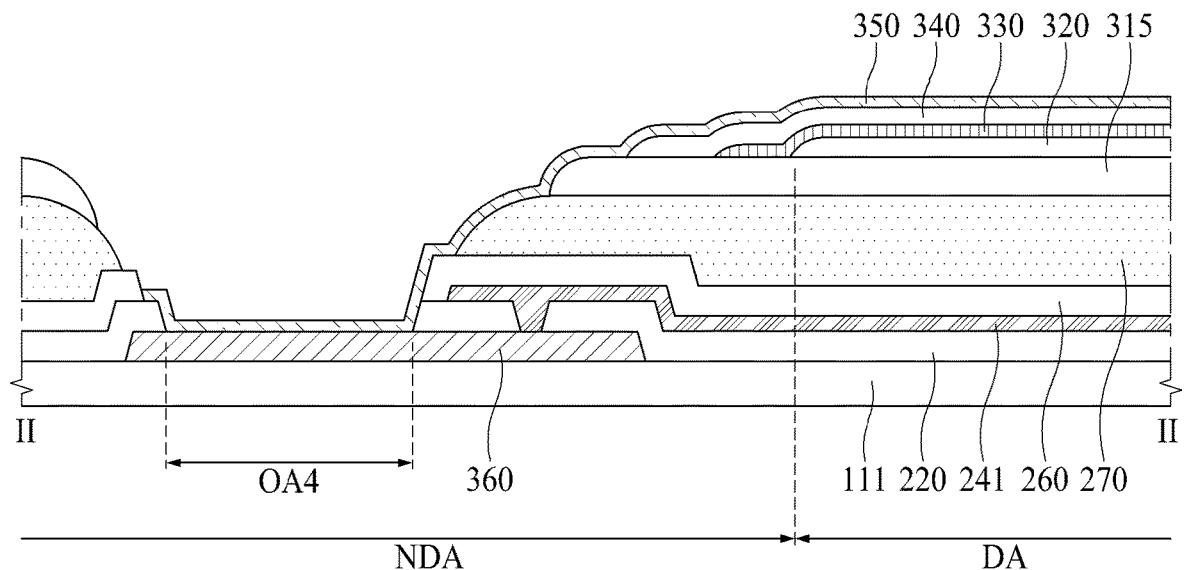
FIG. 8 is a sectional view taken along line II-II in FIG. 3 according to an embodiment of the present disclosure.
Figure 9:
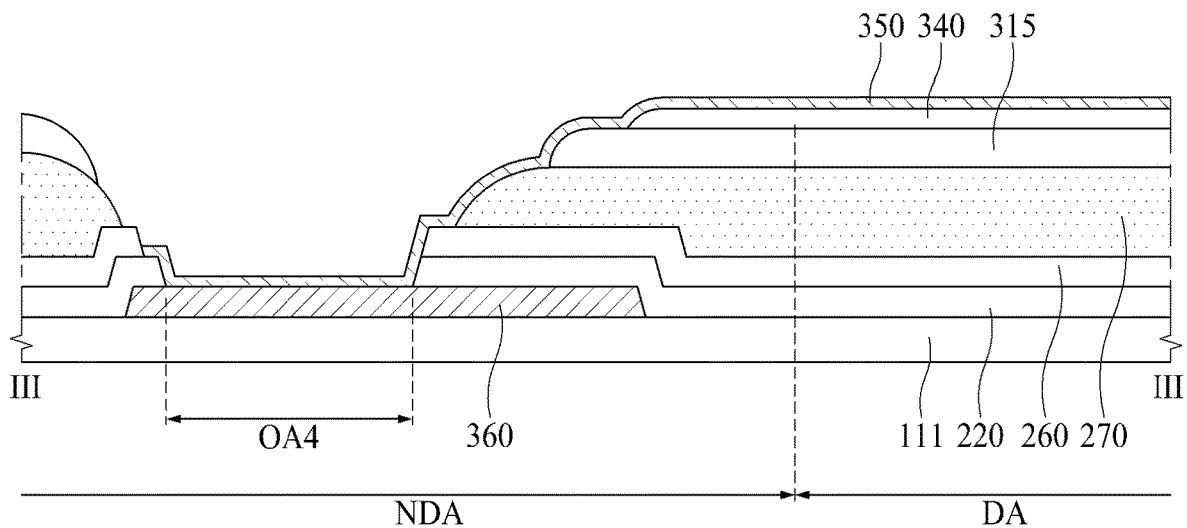
FIG. 9 is a sectional view taken along line III-III in FIG. 3 according to an embodiment of the present disclosure.

FIG. 3 is a plan view schematically illustrating a first substrate of a display panel according to a first embodiment of the present disclosure. FIG. 4 is a sectional view taken along line I-I in FIG. 3. FIG. 5 is a plan view schematically illustrating an example of a first subpixel, a second subpixel, and a third subpixel. FIG. 6 is a plan view illustrating a modified example of FIG. 5. FIG. 7 is an enlarged view illustrating an example of Area A in FIG. 4. FIG. 8 is a sectional view taken along line II-II in FIG. 3. FIG. 9 is a sectional view taken along line III-III in FIG. 3.

Referring to FIGS. 3 to 9, a display panel 110 according to a first embodiment of the present disclosure includes a first substrate 111, a light blocking layer 210, a first insulating film 220, a driving thin-film transistor 230, connection electrodes 241, 242, and 360, a second insulating film 260, a planarization film 270, screen patterns 281, 282, and 283, first electrodes 311, 312, and 313, a bank 315, first light emitting layers 321 and 322, second electrodes 331 and 332, a second light emitting layer 340, and a third electrode 350.

The first substrate 111 is formed of glass or plastic, but is not limited thereto and can be formed of a semiconductor material, such as a silicon wafer. The first substrate 111 can be formed of a transparent material or can be formed of an opaque material.

The first substrate 111 is partitioned into a display area DA and a non-display area NDA. A first subpixel P1, a second subpixel P2, and a third subpixel P3 are provided in the display area DA of the first substrate 111. The first subpixel P1 emits red light, the second subpixel P2 emits green light, and the third subpixel P3 emits blue light, but the present disclosure is not limited thereto. The display area DA of the first substrate 111 can further include a fourth subpixel that emits white W light. The arrangement order of the subpixels P1, P2, and P3 can be modified in various orders.

The display device according to the first embodiment of the present disclosure can employ a so-called bottom emission system in which emitted light is discharged downward, but the present disclosure is not limited thereto. When the display device according to the first embodiment of the present disclosure employs a bottom emission system, the first substrate 111 can be formed of a transparent material. Alternatively, when the display device according to the first embodiment of the present disclosure employs a top emission system in which emitted light is discharged upward, the first substrate 111 can be formed of an opaque material as well as a transparent material.

Various signal lines, a thin-film transistor 230, and circuit elements including a capacitor are provided on the first substrate 111 for each of the subpixels P1, P2, and P3. The signal lines include a gate line, a data line, a power supply line, and a reference line.

When a gate signal is input to the gate line, the thin-film transistor 230 supplies a predetermined voltage to the first electrodes 311, 312, and 313 based on a data voltage of the data line. The thin-film transistor 230 includes an active layer, a gate electrode, a source electrode, and a drain electrode.

The active layer is provided on the first substrate 111. The active layer is formed of a silicon-based semiconductor material or an oxide-based semiconductor material. As illustrated in FIG. 4, a light blocking layer 210 for blocking external light which is incident on the active layer is provided between the first substrate 111 and the active layer. When the light blocking layer 210 is formed of a conductive material, a first insulating film 220 is provided between the active layer and the light blocking layer 210.

The gate insulating film is provided on the active layer. The gate insulating film can be formed of an inorganic film, such as a silicon oxide film, a silicon nitride film, or a multi-layered film thereof.

The gate electrode is provided on the gate insulating film. The gate electrode can be a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof, but is not limited thereto.

An interlayer insulating film is provided on the gate insulating film. The interlayer insulating film is formed of an inorganic film, such as a silicon oxide film, a silicon nitride film, or a multi-layered film thereof.

The source electrode and the drain electrode are provided on the interlayer insulating film. Each of the source electrode and the drain electrode is connected to the active layer via a contact hole that penetrates the gate insulating film and the interlayer insulating film. Each of the source electrode and the drain electrode can be a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof, but is not limited thereto.

The connection electrodes 241, 242, and 360 are provided on the first substrate 111.

The connection electrodes 241, 242, and 360 electrically connect the second electrodes 331 and 332 of each of the first subpixel P1 and the second subpixel P2 to the third electrode 350. More specifically, the connection electrodes 241, 242, and 360 include a first power supply line 241, a second power supply line 242, and an auxiliary power supply line 360.

The auxiliary power supply line 360 is formed to extend in a first direction (an X-axis direction) in the non-display area NDA. As illustrated in FIGS. 8 and 9, a part of the auxiliary power supply line 360 is not covered with the first insulating film 220, the second insulating film 260, and the planarization film 270 but is exposed and the exposed part of the auxiliary power supply line 360 is connected to the third electrode 350.

The auxiliary power supply line 360 is formed of the same material in the same layer as the light blocking layer 210, but is not limited thereto. The auxiliary power supply line 360 can be formed of the same material in the same layer as one of the active layer, the gate electrode, the source electrode, and the drain electrode of the thin-film transistor 230.

The first power supply line 241 is disposed on one side of the first subpixel P1 in the display area DA and is connected to the second electrode 331 of the first subpixel P1. In FIGS. 4 to 6, the first power supply line 241 is disposed between the first subpixel P1 and the third subpixel P3, but is not limited thereto. The first power supply line 241 can be disposed between the first subpixel P1 and the second subpixel P2.

The first power supply line 241 is formed to extend in a second direction (a Y-axis direction) in the display area DA. A plurality of first subpixels P1 are arranged in the second direction in parallel to the first power supply line 241. In this situation, the first power supply line 241 can be connected to the second electrodes 331 of all the first subpixels P1 arranged in a line or can be connected to the second electrodes 331 of some of the first subpixels P1.

On the other hand, a plurality of first subpixels P1 can be arranged in the second direction to alternate with a plurality of second pixels P2. In this situation, the first power supply line 241 is connected to the second electrodes 331 of all the first subpixels P1 or is connected to the second electrodes 331 of some of the first subpixels P1. Alternatively, the first power supply line 241 can be connected to the second electrodes 331 and 332 of all the first subpixels P1 and the second subpixels P2 or can be connected to the second electrodes 331 and 332 of some of the first subpixels P1 and the second subpixels P.

One end of the first power supply line 241 is connected to the auxiliary power supply line 360. The first power supply line 241 is connected to the auxiliary power supply line 360 via a contact hole as illustrated in FIG. 8, but is not limited thereto.

The first power supply line 241 is formed of the same material in the same layer as one of the active layer, the gate electrode, the source electrode, and the drain electrode of the thin-film transistor 230.

As described above, in each first subpixel P1, the second electrode 331 and the third electrode 350 are electrically connected to each other via the first power supply line 241 and the auxiliary power supply line 360. That is, when a low-potential voltage is supplied to the third electrode 350, the second electrode 331 of the first subpixel P1 is supplied with the same low-potential voltage as the third electrode 350.

The second power supply line 242 is disposed on one side of the second subpixel P2 in the display area DA and is connected to the second electrode 332 of the second subpixel P2. In FIGS. 4 to 6, the second power supply line 242 is disposed between the first subpixel P1 and the second subpixel P2, but is not limited thereto. The second power supply line 242 can be disposed between the second subpixel P2 and the third subpixel P3.

The second power supply line 242 is formed to extend in the second direction (the Y-axis direction) in the display area DA. A plurality of second subpixels P2 are arranged in the second direction in parallel to the second power supply line 242. In this situation, the second power supply line 242 can be connected to the second electrodes 332 of all the second subpixels P2 arranged in a line or can be connected to the second electrodes 332 of some of the second subpixels P2.

On the other hand, a plurality of second subpixels P2 can be arranged in the second direction to alternate with a plurality of first pixels P1. In this situation, the second power supply line 242 is connected to the second electrodes 332 of all the second subpixels P2 or is connected to the second electrodes 332 of some of the second subpixels P2. Alternatively, the second power supply line 242 can be connected to the second electrodes 331 and 332 of all the first subpixels P1 and the second subpixels P2 or can be connected to the second electrodes 331 and 332 of some of the first subpixels P1 and the second subpixels P1.

One end of the second power supply line 242 is connected to the auxiliary power supply line 360. The second power supply line 242 is connected to the auxiliary power supply line 360 via a contact hole as illustrated in FIG. 8, but is not limited thereto.

The second power supply line 242 is formed of the same material in the same layer as one of the active layer, the gate electrode, the source electrode, and the drain electrode of the thin-film transistor 230.

As described above, in each second subpixel P2, the second electrode 332 and the third electrode 350 are electrically connected to each other via the second power supply line 242 and the auxiliary power supply line 360. That is, when a low-potential voltage is supplied to the third electrode 350, the second electrode 332 of the second subpixel P2 is supplied with the same low-potential voltage as the third electrode 350.

The second insulating film 260 is provided on the thin-film transistor 230 and the connection electrodes 241, 242, and 360 to protect the thin-film transistor 230. The second insulating film 260 covers the thin-film transistor 230 and exposes parts of the connection electrodes 241, 242, and 360 and the first insulating film 220.

More specifically, the second insulating film 260 includes opening areas OA1, OA2, OA3, and OA4 for exposing parts of the connection electrodes 241, 242, and 360 and the first insulating film 220.

As illustrated in FIG. 4, the second insulating film 260 includes a first opening area OA1 that exposes a part of the first power supply line 241. The first opening area OA1 is formed along the first power supply line 241. Here, the first opening area OA1 is formed in one or more patterns with a predetermined length in the second direction (the Y-axis direction) on one first power supply line 241.

As illustrated in FIG. 4, the second insulating film 260 includes a second opening area OA2 that exposes a part of the second power supply line 242. The second opening area OA2 is formed along the second power supply line 242. Here, the second opening area OA2 is formed in one or more patterns with a predetermined length in the second direction (the Y-axis direction) on one second power supply line 242.

As illustrated in FIG. 4, the second insulating film 260 includes a third opening area OA3 that exposes a part of the first insulating film 220. The third opening area OA3 is disposed on one side of the third subpixel P3 in the display area DA.

In FIGS. 4 to 7, the third opening area OA3 is disposed between the second subpixel P2 and the third subpixel P3, but is not limited thereto. The third opening area OA3 can be disposed between the third subpixel P3 and the first subpixel P1.

The third opening area OA3 is disposed between the second subpixel P2 and the third subpixel P3 and is arranged in parallel to at least one of the first power supply line 241 and the second power supply line 242.

Unlike the first opening area OA1 and the second opening area OA2, the third opening area OA3 may not include a conductive line, such as the first power supply line 241 or the second power supply line 242.

As illustrated in FIGS. 8 and 9, the second insulating film 260 includes a fourth opening area OA4 that exposes a part of the auxiliary power supply line 360. A part of the auxiliary power supply line 360 is exposed by the first insulating film 220 and the fourth opening area OA4 is provided on the exposed auxiliary power supply line 360.

The second insulating film 260 can be formed of an inorganic film, such as a silicon oxide film, a silicon nitride film, or a multi-layered film thereof.

The planarization film 270 is provided on the second insulating film 260 to remove a step difference due to the thin-film transistor 230. Here, the planarization film 270 is not provided on the opening areas OA1, OA2, OA3, and OA4 of the second insulating film 260. Accordingly, parts of the connection electrodes 241, 242, and 360 and the first insulating film 220 are still exposed.

The planarization film 270 has an area less than that of the second insulating film 260. Accordingly, the planarization film 270 can expose a part of the second insulating film 260. Here, the second insulating film 260 is not covered with the planarization film 270 but is exposed in areas adjacent to the opening areas OA1, OA2, OA3, and OA4.

The planarization film 270 is formed of an organic film, such as an acryl resin, an epoxy resin, a phenolic resin, a polyamide resin, or a polyimide resin.

The first electrodes 311, 312, and 313 are formed in patterns of the subpixels P1, P2, and P3 on the planarization film 270. One first electrode 311 is provided in the first subpixel P1, another first electrode 312 is provided in the second subpixel P2, and still another first pixel 313 is provided in the third subpixel P3.

The first electrodes 311, 312, and 313 are connected to the source electrodes or the drain electrodes of the thin-film transistors 230 via contact holes CH1, CH2, and CH3 penetrating the second insulating film 260 and the planarization film 270. The first electrode 311 of the first subpixel P1 is connected to the source electrode or the drain electrode of the thin-film transistor via the contact hole CH1 and is supplied with a first high-potential voltage. The first electrode 312 of the second subpixel P2 is connected to the source electrode or the drain electrode of the thin-film transistor via the contact hole CH2 and is supplied with a second high-potential voltage. The first electrode 313 of the third subpixel P3 is connected to the source electrode or the drain electrode of the thin-film transistor via the contact hole CH3 and is supplied with a third high-potential voltage.

The first electrodes 311, 312, and 313 are formed of a transparent conductive material (TCO), a semi-transmissive conductive material, or a conductive material having high reflectance. When the display device 100 employs a bottom emission system, the first electrodes 311, 312, and 313 can be formed of a transparent conductive material, such as ITO or IZO that can transmit light or a semi-transmissive conductive material, such as magnesium (Mg), silver (Ag), or an alloy of magnesium (Mg) and silver (Ag). When the display device 100 employs a top emission system, the first electrodes 311, 312, and 313 are formed of a conductive material having high reflectance, such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy can be an alloy of silver (Ag), palladium (Pd), copper (Cu), and the like. The first electrodes 311, 312, and 313 serve as anode electrodes.

The screen patterns 281, 282, and 283 are provided on the second insulating film 260 to cover parts of the opening areas OA1, OA2, and OA3 of the second insulating film 260. The screen patterns 281, 282, and 283 include a first screen pattern 281, a second screen pattern 282, and a third screen pattern 283.

The first screen pattern 281 includes a protruding portion 281a that is provided on the second insulating film 260 which is not covered with the planarization film 270 but is exposed therefrom and protrudes to cover a part of the first opening area OA1. Here, the protruding portion 281a of the first screen pattern 281 is separated from the first power supply line 241 to form a space between the first power supply line 241 and the first screen pattern 281.

The first screen pattern 281 is provided close to a subpixel which is disposed adjacent to the first subpixel P1 with the first opening area OA1 interposed therebetween.

For example, the first opening area OA1 that exposes the first power supply line 241 can be disposed between the first subpixel P1 and the third subpixel P3. In this situation, the protruding portion 281a of the first screen pattern 281 protrudes toward the first opening area OA1 in the third subpixel P3. Accordingly, a part of the first opening area OA1 close to the third subpixel P3 is covered with the first screen pattern 281. The first power supply line 241 is also covered with the first screen pattern 281. On the other hand, the other part of the first opening area OA1 close to the first subpixel P1 still exposes the first power supply line 241.

Similar to the first opening area OA1, the first screen pattern 281 is provided along the first power supply line 241. Here, the first screen pattern 281 is formed as a plurality of patterns with a predetermined length in the second direction (the Y-axis direction) on one first power supply line 241 as illustrated in FIG. 5, but is not limited thereto. The first screen pattern 281 can be formed as a single line pattern extending in the second direction (the Y-axis direction) on one first power supply line 241 as illustrated in FIG. 6.

On the other hand, the first screen pattern 281 is formed of the same material in the same layer as the first electrodes 311, 312, and 313, but is not limited thereto. As illustrated in FIG. 4, when the first screen pattern 281 and the first electrodes 311, 312, and 313 are formed of the same material in the same layer, the first screen pattern 281 is separated from the first electrodes 311, 312, and 313.

When the first opening area OA1 of the second insulating film 260 is disposed between the third subpixel P3 and the first subpixel P1, the first screen pattern 281 is separated from the first electrode 313 of the third subpixel P3 such that the first screen pattern 281 is not electrically connected to the first electrode 313 of the third subpixel P3. Here, the first screen pattern 281 is provided on the second insulating film 260 which is not covered with the planarization film 270 but is exposed and is also provided on the planarization film 270.

In the display device, as described above, by forming the first screen pattern 281 out of the same material in the same layer as the first electrodes 311, 312, and 313, the first screen pattern 281 can be formed without adding a particular process.

However, the present disclosure is not limited thereto and the first screen pattern 281 can be provided in a layer different from that of the first electrodes 311, 312, and 313. The first screen pattern 281 can be disposed between the second insulating film 260 and the planarization film 270.

The second screen pattern 282 includes a protruding portion 282a that is provided on the second insulating film 260 which is not covered with the planarization film 270 but is exposed therefrom and protrudes to cover a part of the second opening area OA2. Here, the protruding portion 282a of the second screen pattern 282 is separated from the second power supply line 242 to form a space between the second power supply line 242 and the second screen pattern 282.

The second screen pattern 282 is provided close to a subpixel which is disposed adjacent to the second subpixel P2 with the second opening area OA2 interposed therebetween.

For example, the second opening area OA2 that exposes the second power supply line 242 can be disposed between the first subpixel P1 and the second subpixel P2. In this situation, the protruding portion 282a of the second screen pattern 282 protrudes toward the second opening area OA2 in the first subpixel P1. Accordingly, a part of the second opening area OA2 close to the first subpixel P1 is covered with the second screen pattern 282. The second power supply line 242 is also covered with the second screen pattern 282. On the other hand, the rest of the second opening area OA2 close to the second subpixel P2 still exposes the second power supply line 242.

Similar to the second opening area OA2, the second screen pattern 282 is provided along the second power supply line 242. Here, the second screen pattern 282 is formed as a plurality of patterns with a predetermined length in the second direction (the Y-axis direction) on one second power supply line 242 as illustrated in FIG. 5, but is not limited thereto. The second screen pattern 282 can be formed as a single line pattern extending in the second direction (the Y-axis direction) on one second power supply line 242 as illustrated in FIG. 6.

On the other hand, the second screen pattern 282 is formed of the same material in the same layer as the first electrodes 311, 312, and 313, but is not limited thereto. As illustrated in FIG. 4, when the second screen pattern 282 and the first electrodes 311, 312, and 313 are formed of the same material in the same layer, the second screen pattern 282 is separated from the first electrodes 311, 312, and 313.

When the second opening area OA2 of the second insulating film 260 is disposed between the first subpixel P1 and the second subpixel P2, the second screen pattern 282 is separated from the first electrode 311 of the first subpixel P1 such that the second screen pattern 282 is not electrically connected to the first electrode 311 of the first subpixel P1. Here, the second screen pattern 282 is provided on the second insulating film 260 which is not covered with the planarization film 270 but is exposed therefrom and is also provided on the planarization film 270.

In the display device, as described above, by forming the second screen pattern 282 out of the same material in the same layer as the first electrodes 311, 312, and 313, the second screen pattern 282 can be formed without adding a particular process.

However, the present disclosure is not limited thereto and the second screen pattern 282 can be provided in a layer different from that of the first electrodes 311, 312, and 313. The second screen pattern 282 can be disposed between the second insulating film 260 and the planarization film 270.

The third screen pattern 283 includes a protruding portion 283a that is provided on the second insulating film 260 which is not covered with the planarization film 270 but is exposed therefrom and protrudes to cover a part of the third opening area OA3. Here, the protruding portion 283a of the third screen pattern 283 is separated from the first insulating film 220 to form a space between the first insulating film 220 and the third screen pattern 283.

The third screen pattern 283 is provided close to a subpixel which is disposed adjacent to the third subpixel P3 with the third opening area OA3 interposed therebetween.

For example, the third opening area OA3 that exposes the first insulating film 220 can be disposed between the second subpixel P2 and the third subpixel P3. In this situation, the protruding portion 283a of the third screen pattern 283 protrudes toward the third opening area OA3 in the second subpixel P2. Accordingly, a part of the third opening area OA3 close to the second subpixel P2 is covered with the third screen pattern 283. The first insulating film 22 is also covered with the third screen pattern 283. On the other hand, the rest of the third opening area OA3 close to the third subpixel P3 still exposes the first insulating film 22.

Similar to the third opening area OA3, the third screen pattern 283 is disposed between the second subpixel P2 and the third subpixel P3 to be parallel to at least one of the first power supply line 241 and the second power supply line 242. Here, the third screen pattern 283 is formed as a plurality of patterns with a predetermined length in the second direction (the Y-axis direction) as illustrated in FIG. 5, but is not limited thereto. The third screen pattern 283 can be formed as a single line pattern extending in the second direction (the Y-axis direction) as illustrated in FIG. 6.

On the other hand, the third screen pattern 283 is formed of the same material in the same layer as the first electrodes 311, 312, and 313, but is not limited thereto. As illustrated in FIG. 4, when the third screen pattern 283 and the first electrodes 311, 312, and 313 are formed of the same material in the same layer, the third screen pattern 283 is separated from the first electrodes 311, 312, and 313.

When the third opening area OA3 of the second insulating film 260 is disposed between the second subpixel P2 and the third subpixel P3, the third screen pattern 283 is separated from the second electrode 312 of the second subpixel P2 such that the third screen pattern 283 is not electrically connected to the second electrode 312 of the second subpixel P2. Here, the third screen pattern 283 is provided on the second insulating film 260 which is not covered with the planarization film 270 but is exposed therefrom and is also provided on the planarization film 270.

In the display device, as described above, by forming the third screen pattern 283 out of the same material in the same layer as the first electrodes 311, 312, and 313, the third screen pattern 283 can be formed without adding a particular process.

However, the present disclosure is not limited thereto and the third screen pattern 283 can be provided in a layer different from that of the first electrodes 311, 312, and 313. The third screen pattern 283 can be disposed between the second insulating film 260 and the planarization film 270.

The bank 315 is provided on the planarization film 270 to cover ends of the first electrodes 311, 312, and 313. Accordingly, a problem that a current is concentrated on the ends of the first electrodes 311, 312, and 313 and emission efficiency degrades can be prevented.

On the other hand, the bank 315 is not provided on the opening areas OA1, OA2, OA3, and OA4 of the second insulating film 260. Accordingly, parts of the connection electrodes 241, 242, and 360 and the first insulating film 220 are still exposed.

The bank 315 can also be formed on the screen patterns 281, 282, and 283. Here, the bank 315 is formed such that the protruding portions 281a, 282a, and 283a of the screen patterns 281, 282, and 283 are not covered but exposed.

When the bank 315 is provided to cover the protruding portions 281a, 282a, and 283a of the screen patterns 281, 282, and 283, the first light emitting layers 321 and 322 of the subpixels P1 and P2 are not cut off but connected to each other. The second electrodes 331 and 332 of the subpixels P1 and P2 are not cut off but connected to each other. Accordingly, there may be a problem that the second electrode 331 of the first subpixel P1 is not connected to the first power supply line 241 and the second electrode 332 of the second subpixel P2 is not connected to the second power supply line 242.

In the display device according to the first embodiment of the present disclosure, the bank 315 should be formed such that the protruding portions 281a, 282a, and 283a of the screen patterns 281, 282, and 283 are not covered but exposed to prevent such a problem.

The bank 315 defines an emission area in each of a plurality of subpixels P1, P2, and P3. That is, an exposed area of the first electrodes 311, 312, and 313 which are not covered with the bank 315 but exposed in each of the subpixels P1, P2, and P3 is an emission area. The bank 315 can be formed of an inorganic insulating film with a relatively small thickness or can be formed of an organic insulating film with a relative large thickness.

The first light emitting layers 321 and 322 are provided in the first subpixel P1 and the second subpixel P2. More specifically, the first light emitting layers 321 and 322 are provided on the first electrode 311 of the first subpixel P1 and the first electrode 312 of the second subpixel P2 and are not provided on the first electrode 313 of the third subpixel P3. The first light emitting layers 321 and 322 are also provided on the bank 315.

The first light emitting layers 321 and 322 include a hole transporting layer, a light emitting layer, and an electron transporting layer. In this situation, in the first light emitting layers 321 and 322, holes and electrons move to the light emitting layer via the hole transporting layer and the electron transporting layer and are combined in the light emitting layer to emit light of a predetermined color.

The first light emitting layers 321 and 322 can be one of a red light emitting layer that emits red light, a green light emitting layer that emits green light, a blue light emitting layer that emits blue light, and a yellow light emitting layer that emits yellow light, but are not limited thereto.

The first light emitting layers 321 and 322 are cut off between the first subpixel P1 and the second subpixel P2. More specifically, the second screen pattern 282 is provided between the first subpixel P1 and the second subpixel P2. The first light emitting layers 321 and 322 are cut off between the first subpixel P1 and the second subpixel P2 by the second screen pattern 282. When the first light emitting layers 321 and 322 are deposited in the first and second subpixels P1 and P2, the first light emitting layer 321 that is deposited in the first subpixel P1 is cut off on the protruding portion 282a of the second screen pattern 282 due to a step difference between the protruding portion 282a of the second screen pattern 282 and the second power supply line 242 as illustrated in FIGS. 4 and 7.

The first light emitting layer 322 that is deposited in the second subpixel P2 flows into a space between the protruding portion 282a of the second screen pattern 282 and the second power supply line 242 and is provided under the protruding portion 282a of the second screen pattern 282 as illustrated in FIGS. 4 and 7.

In the display device according to the first embodiment of the present disclosure, it is preferable that the first light emitting layer 321 of the first subpixel P1 and the first light emitting layer 322 of the second subpixel P2 be not in contact with each other but be cut off. Accordingly, when the second electrodes 331 and 332 are deposited on the first light emitting layers 321 and 322, it is possible to secure a space into which the second electrode 332 that is deposited in the second subpixel P2 can flow between the protruding portion 282a of the second screen pattern 282 and the first light emitting layer 322 of the second subpixel P2.

On the other hand, the first light emitting layer 321 of the first subpixel P1 flows into a space between the protruding portion 281a of the first screen pattern 281 and the first power supply line 241 and is provided under the protruding portion 281a of the first screen pattern 281. Here, it is preferable that the first light emitting layer 321 of the first subpixel P1 be not in contact with the protruding portion 281a of the first screen pattern 281. Accordingly, when the second electrode 331 is deposited on the first light emitting layer 321 of the first subpixel P1, it is possible to secure a space into which the second electrode 331 that is deposited in the first subpixel P1 can flow between the protruding portion 281a of the first screen pattern 281 and the first light emitting layer 321 of the first subpixel P1.

The second electrodes 331 and 332 are provided in the first subpixel P1 and the second subpixel P2. More specifically, the second electrodes 331 and 332 are provided on the first light emitting layer 321 of the first subpixel P1 and the first light emitting layer 322 of the second subpixel P2 and are not provided in the third subpixel P3.

The second electrodes 331 and 332 are cut off between the first subpixel P1 and the second subpixel P2. More specifically, the second screen pattern 282 is provided between the first subpixel P1 and the second subpixel P2. The second electrodes 331 and 332 are cut off between the first subpixel P1 and the second subpixel P2 by the second screen pattern 282. When the second electrodes 331 and 332 are deposited on the entire surfaces of the first and second subpixels P1 and P2, the second electrode 331 that is deposited in the first subpixel P1 is cut off on the protruding portion 282a of the second screen pattern 282 due to a step difference between the protruding portion 282a of the second screen pattern 282 and the second power supply line 242 as illustrated in FIGS. 4 and 7.

The second electrode 332 that is deposited in the second subpixel P2 flows into a space between the protruding portion 282a of the second screen pattern 282 and the first light emitting layer 322 and is provided under the protruding portion 282a of the second screen pattern 282 as illustrated in FIGS. 4 and 7. Here, the second electrode 332 of the second subpixel P2 can be deposited with an area larger than that of the first light emitting layer 322 under the protruding portion 282a of the second screen pattern 282. Accordingly, the second electrode 332 of the second subpixel P2 can be connected to the second power supply line 242.

Since the second electrode 332 of the second subpixel P2 is connected to the second power supply line 242, the second electrode 332 and the third electrode 350 are electrically connected to each other via the second power supply line 242 and the auxiliary power supply line 360. Accordingly, when the third electrode 350 is supplied with a low-potential voltage, the second electrode 332 of the second subpixel P2 is supplied with the same low-potential voltage as that of the third electrode 350. Here, the second electrode 332 of the second subpixel P2 can serve as a cathode electrode.

In FIGS. 4 and 7, the second electrode 331 of the first subpixel P1 and the second electrode 332 of the second subpixel P2 are not in contact with each other but are cut off, but the present disclosure is not limited thereto. Both the second electrodes 331 and 332 of the first and second subpixels P2 can serve as a cathode electrode and can be supplied with a common voltage. The second electrodes 331 and 332 of the first subpixel P1 and the second subpixel P2 can be provided in contact with each other and be electrically connected to each other.

On the other hand, the second electrode 331 of the first subpixel P1 flows into a space between the protruding portion 281a of the first screen pattern 281 and the first power supply line 241 and is provided under the protruding portion 281a of the first screen pattern 281. Here, the second electrode 331 of the first subpixel P1 can be deposited with an area larger than that of the first light emitting layer 321 under the protruding portion 281a of the first screen pattern 281. Accordingly, the second electrode 331 of the first subpixel P1 can be connected to the first power supply line 241.

Since the second electrode 331 of the first subpixel P1 is connected to the first power supply line 241, the second electrode 331 and the third electrode 350 are electrically connected to each other via the first power supply line 241 and the auxiliary power supply line 360. Accordingly, when the third electrode 350 is supplied with a low-potential voltage, the second electrode 331 of the first subpixel P1 is supplied with the same low-potential voltage as that of the third electrode 350. Here, the second electrode 331 of the first subpixel P1 can serve as a cathode electrode.

The second electrodes 331 and 332 are formed of a transparent conductive material (TCO), such as ITO or IZO that can transmit light or a semi-transmissive conductive material, such as magnesium (Mg), silver (Ag), or an alloy of magnesium (Mg) and silver (Ag).

The second light emitting layer 340 is provided as a common layer in the First subpixel P1, the second subpixel P2, and the third subpixel P3. More specifically, the second light emitting layer 340 is provided on the second electrode 331 of the first subpixel P1, the second electrode 332 of the second subpixel P2, and the first electrode 313 of the third subpixel P3.

The second light emitting layer 340 includes a hole transporting layer, a light emitting layer, and an electron transporting layer. In this situation, in the second light emitting layer 340, holes and electrons move to the light emitting layer via the hole transporting layer and the electron transporting layer and are combined in the light emitting layer to emit light of a predetermined color.

The second light emitting layer 340 can be one of a red light emitting layer that emits red light, a green light emitting layer that emits green light, a blue light emitting layer that emits blue light, and a yellow light emitting layer that emits yellow light, but are not limited thereto.

Here, the second light emitting layer 340 emits light of a color different from that of the first light emitting layers 321 and 322. When the first light emitting layers 321 and 322 are light emitting layers emitting light of a first color, the second light emitting layer 340 can be a light emitting layer emitting light of a second color which is different from the first color. For example, the first light emitting layers 321 and 322 can be yellow light emitting layers that emit yellow light and the second light emitting layer 340 can be a blue light emitting layer that emits blue light.

Unlike the first light emitting layers 321 and 322, the second light emitting layer 340 is connected between the first subpixel P1 and the second subpixel P2 and between the third subpixel P3 and the first subpixel P1. The second light emitting layer 340 can be provided while partially filling a space between the screen patterns 281 and 282. Here, an air gap AG is provided in a space which is not filled with the second light emitting layer 340 between the screen patterns 281 and 282 and the second electrodes 331 and 332.

On the other hand, the second light emitting layer 340 is cut off between the second subpixel P2 and the third subpixel P3. The third screen pattern 283 is provided between the second subpixel P2 and the third subpixel P3. The second light emitting layer 340 is cut off between the second subpixel P2 and the third subpixel P3 by the third screen pattern 283. Unlike the first and second screen patterns 281 and 282, the first and second power supply lines 241 and 242 are not provided under the third screen pattern 283. Unlike the first and second screen patterns 281 and 282, the first light emitting layers 321 and 322 and the second electrodes 331 and 332 are not provided under the third screen pattern 283.

A step difference between the third screen pattern 283 and the first insulating film 220 is larger than a step difference between the first screen pattern 281 and the second electrode 331 or a step difference between the second screen pattern 282 and the second electrode 332. Accordingly, when the second light emitting layer 340 is deposited on the entire surfaces of the first, second, and third subpixels P1, P2, and P3, the second light emitting layer 340 is provided to partially fill a space between the first and second screen patterns 281 and 282 and is connected to each other between the first subpixel P1 and the second subpixel P2. On the other hand, the second light emitting layer 340 is cut off between the second subpixel P2 and the third subpixel P3 due to a large step difference between the third screen pattern 283 and the first insulating film 220. The second light emitting layer 340 flows into a space between the protruding portion 283a of the third screen pattern 283 and the first insulating film 220 and is provided under the protruding portion 283a of the third screen pattern 283.

The third electrode 350 is provided as a common layer in the first subpixel P1, the second subpixel P2, and the third subpixel P3. The third electrode 350 is provided on the second light emitting layer 340 of the first, second, and third subpixels P1, P2, and P3.

The third electrode 350 is connected between the first subpixel P1 and the second subpixel P2 and between the third subpixel P3 and the first subpixel P1. On the other hand, the third electrode 350 is cut off between the second subpixel P2 and the third subpixel P3 due to a large step difference between the third screen pattern 283 and the first insulating film 220. Here, the third electrode 350 flows into a space between the protruding portion 283a of the third screen pattern 283 and the second light emitting layer 340 and is provided under the protruding portion 283a of the third screen pattern 283. Here, the third electrode 350 of the third subpixel P3 can be deposited with an area larger than that of the second light emitting layer 340 under the protruding portion 283a of the third screen pattern 283.

The third electrode 350 is formed of a transparent conductive material, a semi-transmissive conductive material, or a conductive material having high reflectance. When the display device 100 employs a bottom emission system, the third electrode 350 can be formed of a conductive material having high reflectance, such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy can be an alloy of silver (Ag), palladium (Pd), copper (Cu), and the like. When the display device 100 employs a top emission system, the third electrode 350 can be formed of a transparent conductive material (TCO), such as ITO or IZO that can transmit light or a semi-transmissive conductive material, such as magnesium (Mg), silver (Ag), or an alloy of magnesium (Mg) and silver (Ag). The third electrode 350 can serve as a cathode electrode.

In the display device according to the first embodiment of the present disclosure, only the first light emitting layers 321 and 322 emit light in the first and second subpixels P1 and P2 and only the second light emitting layer 340 emits light in the third subpixel P3.

More specifically, the first light emitting layer 321 emits light in the first subpixel P1. In the first subpixel P1, since the second electrode 331 is connected to the first power supply line 241, the second electrode 331 and the third electrode 350 are electrically connected via the first power supply line 241 and the auxiliary power supply line 360. When the third electrode 350 is supplied with a low-potential voltage, the second electrode 331 of the first subpixel P1 is supplied with the same low-potential voltage as the third electrode 350. Accordingly, in the first subpixel P1, the second light emitting layer 340 provided between the second electrode 331 and the third electrode 350 does not emit light.

On the other hand, in the first subpixel P1, when the first electrode 311 is supplied with a first high-potential voltage and the second electrode 331 is supplied with a low-potential voltage, the first light emitting layer 321 provided between the first electrode 311 and the second electrode 331 emits light with predetermined brightness in response to a predetermined current.

In the second subpixel P2, the first light emitting layer 322 emits light. In the second subpixel P2, since the second electrode 332 is connected to the second power supply line 242, the second electrode 332 and the third electrode 350 are electrically connected via the second power supply line 242 and the auxiliary power supply line 360. When the third electrode 350 is supplied with a low-potential voltage, the second electrode 332 of the second subpixel P2 is supplied with the same low-potential voltage as the third electrode 350. Accordingly, in the second subpixel P2, the second light emitting layer 340 provided between the second electrode 332 and the third electrode 350 does not emit light.

On the other hand, in the second subpixel P2, when the first electrode 312 is supplied with a first high-potential voltage and the second electrode 332 is supplied with a low-potential voltage, the first light emitting layer 322 provided between the first electrode 312 and the second electrode 332 emits light with predetermined brightness in response to a predetermined current.

In the first subpixel P1 and the second subpixel P2, the first light emitting layers 321 and 322 emit light of the same color. The display device according to the first embodiment of the present disclosure can further include a color filter to cause the first subpixel P1 and the second subpixel P2 to emit light of different colors.

The color filter can include a first color filter that is disposed to correspond to the first subpixel P1 and a second color filter that is disposed to correspond to the second subpixel P2. The first color filter and the second color filter transmit light of different colors.

For example, the first light emitting layers 321 and 322 can be a yellow light emitting layer that emits yellow light. The first color filter can be a red color filter that transmits red light, and the second color filter can be a green color filter that transmits green light. Accordingly, the first subpixel P1 emits red light and the second subpixel P2 emits green light.

The color filter can be disposed under the first electrodes 311 and 312 or over the third electrode 350 depending on an emission system of the display device 100. When the display device 100 employs a bottom emission system, the color filter is provided under the first electrodes 311 and 312. When the display device 100 employs a top emission system, the color filter is provided over the third electrode 350.

In the third subpixel P3, the second light emitting layer 340 emits light. The first light emitting layer and the second electrode are not provided in the third subpixel P3. In the third subpixel P3, when the first electrode 313 is supplied with a third high-potential voltage and the third electrode 350 is supplied with a low-potential voltage, the second light emitting layer 340 provided between the first electrode 313 and the third electrode 350 emits light with predetermined brightness in response to a predetermined current.

For example, the third subpixel P3 can be a blue light emitting layer that emits blue light. In this situation, the display device 100 can realize a blue subpixel without providing a color filter at a position corresponding to the third subpixel P3.

As described above, in the display device 100 according to the first embodiment of the present disclosure, only the first light emitting layers 321 and 322 emit light in the first subpixel P1 and the second subpixel P2 and only the second light emitting layer 340 emits light in the third subpixel P3. Accordingly, in the display device 100 according to the first embodiment of the present disclosure, it is possible to markedly reduce power consumption in comparison with a situation in which the first light emitting layers 321 and 322 and the second light emitting layer 340 in all the subpixels emit light.

In the display device 100 according to the first embodiment of the present disclosure, the second light emitting layer 340 is provided on the entire surfaces of the subpixels P1, P2, and P3 without using a mask. Accordingly, the display device 100 according to the first embodiment of the present disclosure can solve problems in that different light emitting layers are provided in patterns in the subpixels P1, P2, and P3 using a mask.

In the display device 100 according to the first embodiment of the present disclosure, the second electrodes 331 and 332 are cut off between the subpixels P1, P2, and P3 using the screen patterns 281, 282, and 283. In the display device 100 according to the first embodiment of the present disclosure, the screen patterns 281, 282, and 283 are provided and a photoresist pattern is provided in the third subpixel P3. The first light emitting layers 321 and 322 and the second electrodes 331 and 332 are cut off between the subpixels P1, P2, and P3 by the screen patterns 281, 282, and 283. Particularly, the second electrodes 331 and 332 are connected to one of the first power supply line 241 and the second power supply line 242 under the protruding portions 281a, 282a, 283a of the screen patterns 281, 282, and 283.

Referring to FIG. 7, in the display device 100 according to the first embodiment of the present disclosure, the thickness T1 of the second insulating film 260 is designed such that the second electrodes 331 and 332 are cut off between the first subpixel P1 and the second subpixel P2, and the second light emitting layer 340 is not cut off but is connected between the first subpixel P1 and the second subpixel P2. Here, the thickness T1 of the second insulating film 260 corresponds to a distance between the protruding portions 281a, 282a, 283a of the screen patterns 281, 282, and 283 and one of the first power supply line 241 and the second power supply line 242.

The thickness T1 of the second insulating film 260 is designed to be greater than the sum of the thickness T3 of the first light emitting layers 321 and 322 and the thickness T2 of the second electrodes 331 and 332. Accordingly, with the display device 100 according to the first embodiment of the present disclosure, it is possible to prevent the second electrodes 331 and 332 from being connected between the first subpixel P1 and the second subpixel P2 (e.g., the corresponding second electrode terminates in the gap between adjacent subpixels, as shown in FIG. 7).

The thickness T1 of the second insulating film 260 is designed to be less than the sum of the thickness T3 of the first light emitting layers 321 and 322, the thickness T2 of the second electrodes 331 and 332, and the thickness T4 of the second light emitting layer 340. Accordingly, with the display device 100 according to the first embodiment of the present disclosure, it is possible to prevent the second light emitting layer 340 from being cut off between the first subpixel P1 and the second subpixel P2 (e.g., the second light emitting layer 340 extends across the gap between the first subpixel P1 and the second subpixel P2, as shown in FIG. 7).

On the other hand, in the display device 100 according to the first embodiment of the present disclosure, the length L1 of the protruding portions 281a, 282a, and 283a of the screen patterns 281, 282, and 283 can be appropriately designed. When the length L1 of the protruding portions 281a, 282a, and 283a of the screen patterns 281, 282, and 283 is excessively large, the protruding portions may droop due to their own weight. In this situation, a space sufficient for forming the first light emitting layers 321 and 322 and the second electrodes 331 and 332 may not be secured under the protruding portions 281a, 282a, and 283a of the screen patterns 281, 282, and 283.

On the other hand, when the length L1 of the protruding portions 281a, 282a, and 283a of the screen patterns 281, 282, and 283 excessively small, a contact area between the second electrodes 331 and 332 and one of the first power supply line 241 and the second power supply line 242 may decrease. In this situation, resistance between the second electrodes 331 and 332 and one of the first power supply line 241 and the second power supply line 242 may increase.

Figure 10:
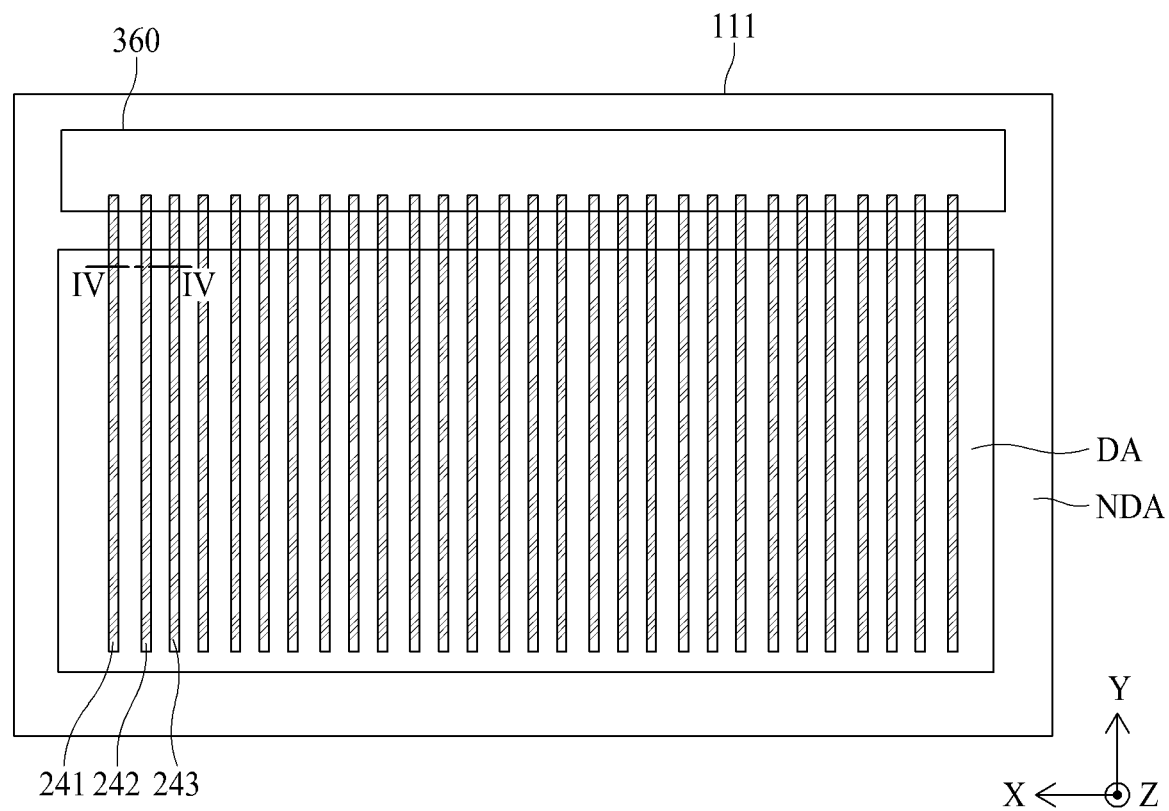
FIG. 10 is a plan view schematically illustrating a first substrate of a display panel according to another embodiment of the present disclosure.
Figure 11:
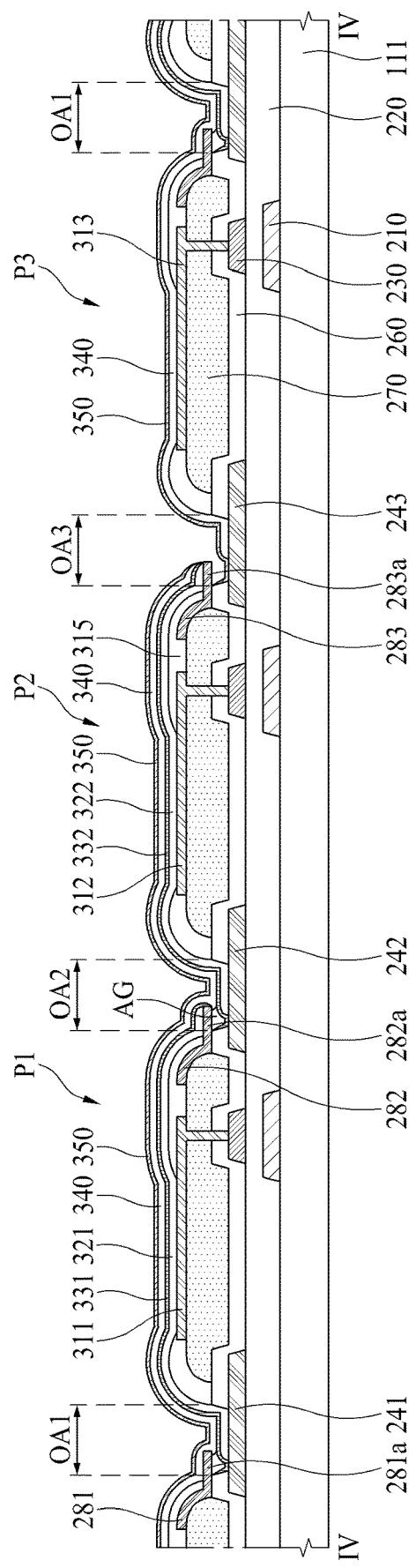
FIG. 11 is a sectional view taken along line IV-IV in FIG. 10 according to an embodiment of the present disclosure.
Figure 12:
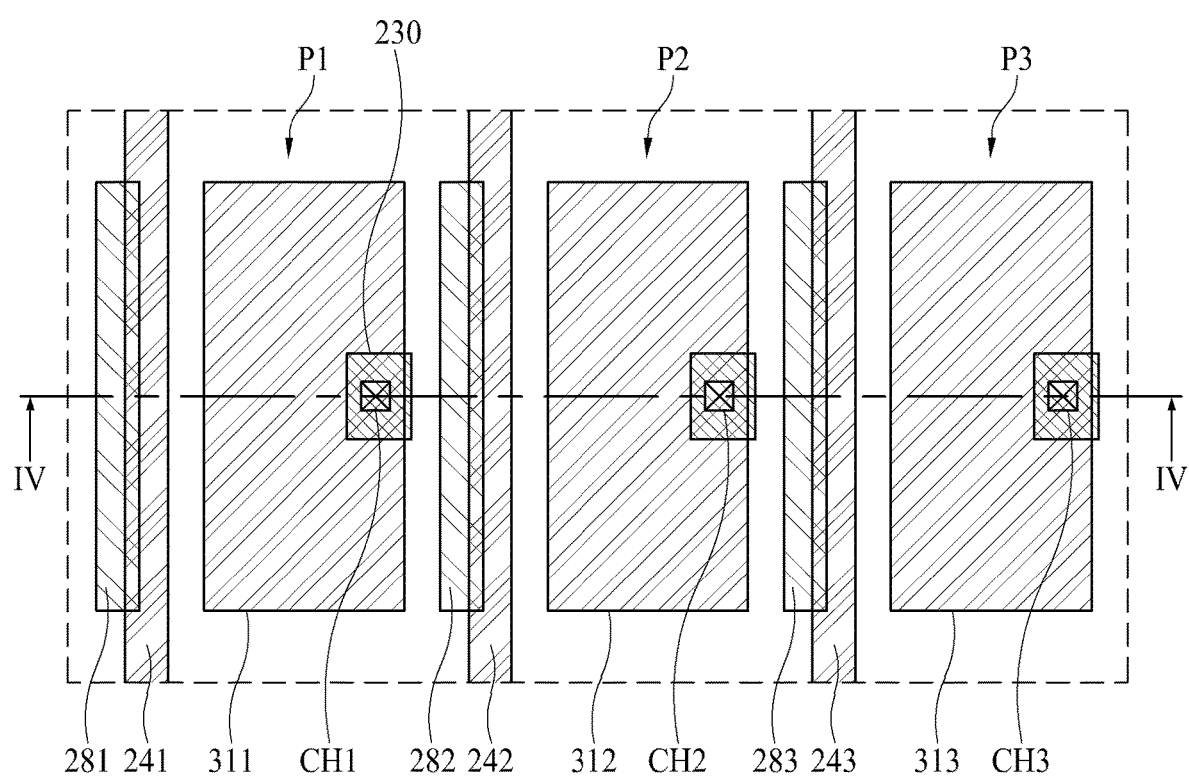
FIG. 12 is a plan view schematically illustrating an example of a first subpixel, a second subpixel, and a third subpixel according to an embodiment of the present disclosure.

FIG. 10 is a plan view schematically illustrating a first substrate of a display panel according to a second embodiment of the present disclosure. FIG. 11 is a sectional view taken along line IV-IV in FIG. 10. FIG. 12 is a plan view schematically illustrating an example of a first subpixel, a second subpixel, and a third subpixel.

Referring to FIGS. 10 to 12, a display panel 110 according to a second embodiment of the present disclosure includes a first substrate 111, a light blocking layer 210, a first insulating film 220, a driving thin-film transistor 230, connection electrodes 241, 242, 243, and 360, a second insulating film 260, a planarization film 270, screen patterns 281, 282, and 283, first electrodes 311, 312, and 313, a bank 315, first light emitting layers 321 and 322, second electrodes 331 and 332, a second light emitting layer 340, and a third electrode 350.

The display panel 110 according to the second embodiment of the present disclosure is different from the display panel 110 according to the first embodiment of the invention illustrated in FIGS. 3 to 9 in that a third power supply line 243 is further provided. Accordingly, elements other than the connection electrodes 241, 242, 243, and 360 and the screen patterns 281, 282, and 283 in the display panel 110 according to the second embodiment of the present disclosure are substantially the same as the elements in the display panel 110 according to the first embodiment of the present disclosure. In the following description, the first substrate 111, the light blocking layer 210, the first insulating film 220, the driving thin-film transistor 230, the second insulating film 260, the planarization film 270, the first electrodes 311, 312, and 313, the bank 315, the first light emitting layers 321 and 322, the second electrodes 331 and 332, the second light emitting layer 340, and the third electrode 350 will not be specifically described.

The connection electrodes 241, 242, 243, and 360 are provided on the first substrate 111.

The connection electrodes 241, 242, 243, and 360 include a first power supply line 241, a second power supply line 242, a third power supply line 243, and an auxiliary power supply line 360. The first power supply line 241, the second power supply line 242, and the auxiliary power supply line 360 have substantially the same configurations as those of the display panel 110 according to the first embodiment of the present disclosure illustrated in FIGS. 3 to 9 and thus description thereof will not be repeated.

The third power supply line 243 is disposed on one side of the third subpixel P3 in the display area DA and is connected to the third electrode 350 of the third subpixel P3. In FIGS. 11 and 12, the third power supply line 243 is disposed between the second subpixel P2 and the third subpixel P3, but is not limited thereto. The third power supply line 243 can be disposed between the first subpixel P1 and the third subpixel P3.

The third power supply line 243 is disposed in the display area DA and extends in the second direction (the Y-axis direction). A plurality of third subpixels P3 are arranged in the second direction in parallel to the third power supply line 243. In this situation, the third power supply line 243 can be connected to the third electrodes 333 of all of the plurality of third subpixels P3 arranged in parallel thereto or can be connected to the third electrodes 333 of some of the plurality of third subpixels P3.

One end of the third power supply line 243 is connected to the auxiliary power supply line 360. The third power supply line 243 is connected to the auxiliary power supply line 360 via a contact hole, but is not limited thereto.

As described above, in the third subpixel P3, the third electrode 350 is supplied with a low-potential voltage via the third power supply line 243 and the auxiliary power supply line 360. In the display device 100 according to the second embodiment of the present disclosure, the third electrode 350 of the third subpixel P3 is supplied with a low-potential voltage via the third power supply line 243 extending in the second direction. Accordingly, it is possible to reduce a voltage drop in the third electrodes 250 of a plurality of third subpixels P3 which are arranged in the second direction.

The third power supply line 243 is formed of the same material in the same layer as one of the active layer, the gate electrode, the source electrode, and the drain electrode of the thin-film transistor 230.

The second insulating film 260 is provided on the thin-film transistor 230 and the connection electrodes 241, 242, 243, and 360 to protect the thin-film transistor 230. The second insulating film 260 covers the thin-film transistor 230 and exposes parts of the connection electrodes 241, 242, 243, and 360 and the first insulating film 220.

More specifically, the second insulating film 260 includes opening areas OA1, OA2, OA3, and OA4 for exposing parts of the connection electrodes 241, 242 and 360 and the first insulating film 220.

The first, second, and fourth opening areas OA1, OA2, and OA4 have substantially the same configurations as those of the display panel 110 according to the first embodiment of the present disclosure described above with reference to FIGS. 3 to 9 and thus description thereof will not be repeated.

The second insulating film 260 includes the third opening area OA3 that exposes the third power supply line 243 as illustrated in FIG. 11. The third opening area OA3 is provided along the third power supply line 243. Here, the third opening area OA3 is formed in one or more patterns with a predetermined length in the second direction (the Y-axis direction) on one third power supply line 243.

The second insulating film 260 can be formed of an inorganic film, such as a silicon oxide film, a silicon nitride film, or a multi-layered film thereof.

The screen patterns 281, 282, and 283 are provided on the second insulating film 260 to cover parts of the opening areas OA1, OA2, OA3, and OA4. The screen patterns 281, 282, and 283 include a first screen pattern 281, a second screen pattern 282, and a third screen pattern 283.

The first and second screen patterns 281 and 282 have substantially the same configurations as those of the display panel 110 according to the first embodiment of the present disclosure described above with reference to FIGS. 3 to 9 and description thereof will not be repeated.

The third screen pattern 283 includes a protruding portion 283a that is provided on the second insulating film 260 which is not covered with the planarization film 270 but is exposed therefrom and protrudes to cover a part of the third opening area OA3. Here, the protruding portion 283a of the third screen pattern 283 is separated from the first insulating film 220 to form a space between the third power supply line 243 and the third screen pattern 283.

The third screen pattern 283 is provided close to a subpixel which is disposed adjacent to the third subpixel P3 with the third opening area OA3 interposed therebetween.

For example, the third opening area OA3 that exposes the third power supply line 243 can be disposed between the second subpixel P2 and the third subpixel P3. In this situation, the protruding portion 283a of the third screen pattern 283 protrudes toward the third opening area OA3 in the second subpixel P2. Accordingly, a part of the third opening area OA3 close to the second subpixel P2 is covered with the third screen pattern 283. The third power supply line 243 is also covered with the third screen pattern 283. On the other hand, the other part of the third opening area OA3 close to the third subpixel P3 still exposes the third power supply line 243.

Similar to the third opening area OA3, the third screen pattern 283 is provided along the third power supply line 243. Here, the third screen pattern 283 is formed as a plurality of patterns with a predetermined length in the second direction (the Y-axis direction) on one first power supply line 241 as illustrated in FIG. 12, but is not limited thereto. The third screen pattern 283 can be formed as a single line pattern extending in the second direction (the Y-axis direction).

On the other hand, the third screen pattern 283 is formed of the same material in the same layer as the first electrodes 311, 312, and 313, but is not limited thereto. As illustrated in FIG. 11, when the third screen pattern 283 and the first electrodes 311, 312, and 313 are formed of the same material in the same layer, the third screen pattern 283 is separated from the first electrodes 311, 312, and 313.

When the third opening area OA3 of the second insulating film 260 is disposed between the second subpixel P2 and the third subpixel P3, the third screen pattern 283 is separated from the second electrode 312 of the second subpixel P2 such that the third screen pattern 283 is not electrically connected to the second electrode 312 of the second subpixel P2. Here, the third screen pattern 283 is provided on the second insulating film 260 which is not covered with the planarization film 270 but is exposed and is also provided on the planarization film 270.

In the display device, as described above, by forming the third screen pattern 283 out of the same material in the same layer as the first electrodes 311, 312, and 313, the third screen pattern 283 can be formed without adding a particular process.

However, the present disclosure is not limited thereto and the third screen pattern 283 can be provided in a layer different from that of the first electrodes 311, 312, and 313. The third screen pattern 283 can be disposed between the second insulating film 260 and the planarization film 270.

Unlike the display device 100 according to the first embodiment of the present disclosure, in the display device 100 according to the second embodiment of the present disclosure, the second light emitting layer 340 of the third subpixel P3 flows into a space between the protruding portion 283a of the third screen pattern 283 and the third power supply line 243 and is provided under the protruding portion 283a of the third screen pattern 283 and on the third power supply line 243.

In the display device 100 according to the second embodiment of the present disclosure, the third electrode 350 of the third subpixel P3 flows into a space between the protruding portion 283a of the third screen pattern 283 and the second light emitting layer 340 and is provided under the protruding portion 283a of the third screen pattern 283. Here, unlike the display device 100 according to the first embodiment of the present disclosure, in the display device 100 according to the second embodiment of the present disclosure, the third electrode 350 of the third subpixel P3 is deposited with an area larger than that of the second light emitting layer 340 under the protruding portion 283a of the third screen pattern 283 and is connected to the third power supply line 243.

In the third subpixel P3, since the third electrode 350 is connected to the third power supply line 243, the third electrode 350 is supplied with a low-potential voltage via the third power supply line 243 and the auxiliary power supply line 360.

Figure 13:
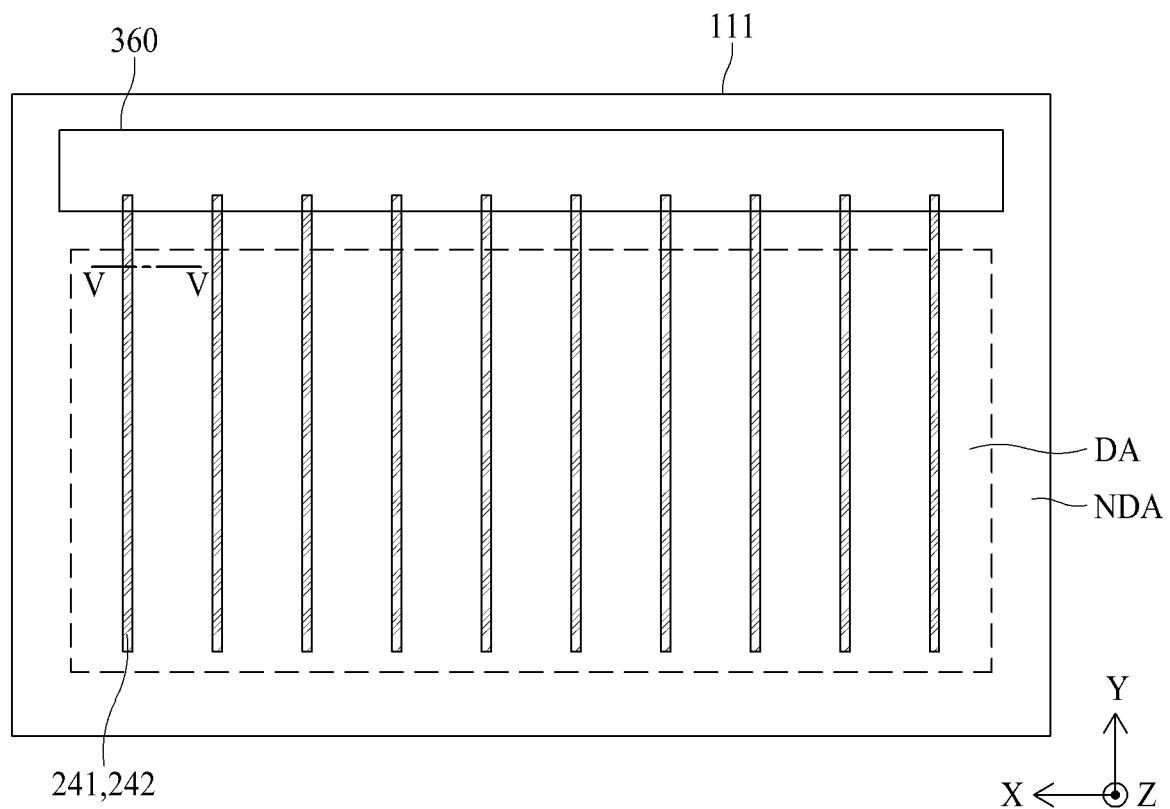
FIG. 13 is a plan view schematically illustrating a first substrate of a display panel according to another embodiment of the present disclosure.
Figure 14:
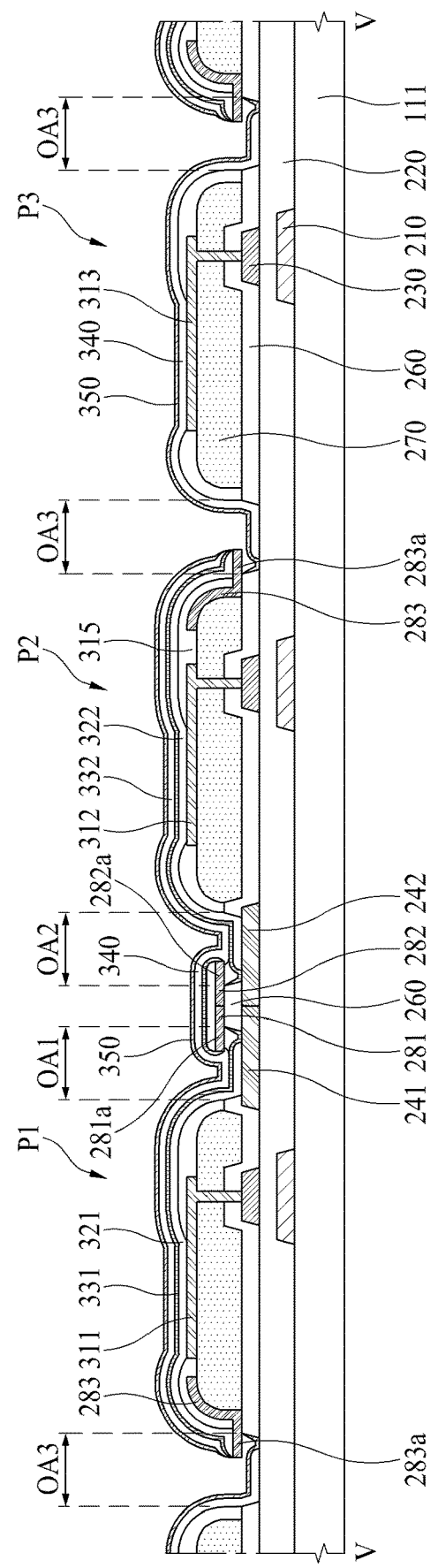
FIG. 14 is a sectional view taken along line V-V in FIG. 13 according to an embodiment of the present disclosure.
Figure 15:
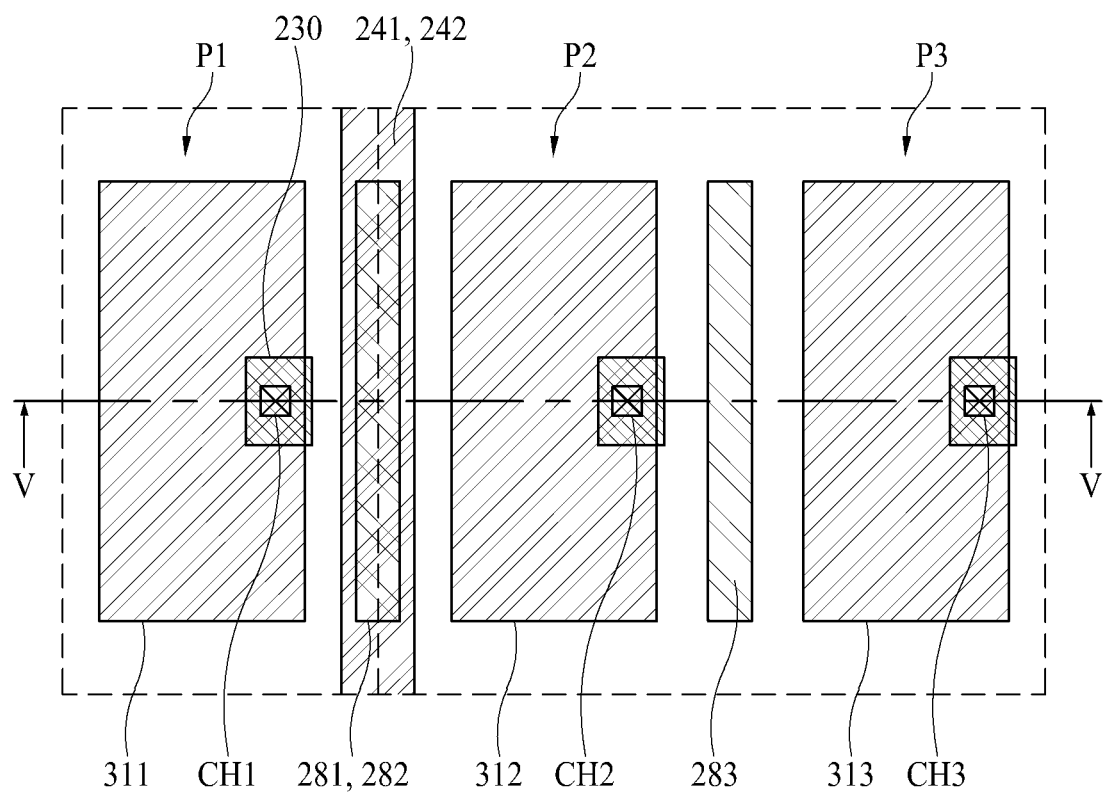
FIG. 15 is a plan view schematically illustrating an example of a first subpixel, a second subpixel, and a third subpixel according to an embodiment of the present disclosure.

FIG. 13 is a plan view schematically illustrating a first substrate of a display panel according to a third embodiment of the present disclosure. FIG. 14 is a sectional view taken along line IV-IV in FIG. 13. FIG. 15 is a plan view schematically illustrating an example of a first subpixel, a second subpixel, and a third subpixel.

Referring to FIGS. 13 to 15, a display panel 110 according to a third embodiment of the present disclosure includes a first substrate 111, a light blocking layer 210, a first insulating film 220, a driving thin-film transistor 230, connection electrodes 241, 242, and 360, a second insulating film 260, a planarization film 270, screen patterns 281, 282, and 283, first electrodes 311, 312, and 313, a bank 315, first light emitting layers 321 and 322, second electrodes 331 and 332, a second light emitting layer 340, and a third electrode 350.

The display panel 110 according to the third embodiment of the present disclosure is different from the display panel 110 according to the first embodiment of the invention illustrated in FIGS. 3 to 9 in that the first power supply line 241 and the second power supply line 242 are formed integrally (e.g., they are connected to each other, or a shared line). Accordingly, elements other than the connection electrodes 241, 242, and 360 and the screen patterns 281, 282, and 283 in the display panel 110 according to the third embodiment of the present disclosure are substantially the same as the elements in the display panel 110 according to the first embodiment of the present disclosure illustrated in FIGS. 3 to 9. In the following description, the first substrate 111, the light blocking layer 210, the first insulating film 220, the driving thin-film transistor 230, the second insulating film 260, the planarization film 270, the first electrodes 311, 312, and 313, the bank 315, the first light emitting layers 321 and 322, the second electrodes 331 and 332, the second light emitting layer 340, and the third electrode 350 will not be specifically described.

The connection electrodes 241, 242, and 360 are provided on the first substrate 111.

The connection electrodes 241, 242, and 360 electrically connect the second electrodes 331 and 332 of the first subpixel P1 and the second subpixel P2 to the third electrode 350. More specifically, the connection electrodes 241, 242, and 360 include a first power supply line 241, a second power supply line 242, and an auxiliary power supply line 360.

The auxiliary power supply line 360 is formed to extend in the first direction (the X-axis direction) in the non-display area NDA. A part of the auxiliary power supply line 360 is not covered with the first insulating film 220, the second insulating film 260, and the planarization film 270 but is exposed therefrom and the exposed part is connected to the third electrode 350.

The first power supply line 241 is disposed between the first subpixel P1 and the second subpixel P2 in the display area DA and is connected to the second electrode 331 of the first subpixel P1. The second power supply line 242 is disposed between the first subpixel P1 and the second subpixel P2 in the display area DA and is connected to the second electrode 332 of the second subpixel P2. Here, in the display device 100 according to the third embodiment of the present disclosure, the first power supply line 241 and the second power supply line 242 are formed integrally.

The first power supply line 241 and the second power supply line 242 are formed to extend in the second direction (the Y-axis direction) in the display area DA. Ends on one side of the first power supply line 241 and the second power supply line 242 are connected to the auxiliary power supply line 360. Here, the first power supply line 241 and the second power supply line 242 are connected to the auxiliary power supply line 360 via contact holes but are not limited thereto.

The first power supply line 241 and the second power supply line 242 are formed of the same material in the same layer as one of the active layer, the gate electrode, the source electrode, and the drain electrode of the thin-film transistor 230.

As described above, in the first subpixel P1, the second electrode 331 and the third electrode 350 are electrically connected to each other via the first power supply line 241, and the second power supply line 242, and the auxiliary power supply line 360. That is, when a low-potential voltage is supplied to the third electrode 350, the second electrode 331 of the first subpixel P1 is supplied with the same low-potential voltage as the third electrode 350.

In the second subpixel P2, the second electrode 332 and the third electrode 350 are electrically connected to each other via the first power supply line 241, the second power supply line 242, and the auxiliary power supply line 360. That is, when a low-potential voltage is supplied to the third electrode 350, the second electrode 332 of the second subpixel P2 is supplied with the same low-potential voltage as the third electrode 350.

The screen patterns 281, 282, and 283 are provided on the second insulating film 260 to cover parts of the opening areas OA1, OA2, and OA3 of the second insulating film 260. The screen patterns 281, 282, and 283 include a first screen pattern 281, a second screen pattern 282, and a third screen pattern 283.

The first screen pattern 281 is provided between the first subpixel P1 and the second subpixel P2. Particularly, the first screen pattern 281 is provided on the second insulating film 260 which is provided between the first opening area OA1 that exposes a part of the first power supply line 241 and the second opening area OA2 that exposes a part of the second power supply line 242.

The first screen pattern 281 includes a protruding portion 281a that protrudes to cover a part of the first opening area OA1. Here, the protruding portion 281a of the first screen pattern 281 is separated from the first power supply line 241 to form a space between the first power supply line 241 and the first screen pattern 281.

The protruding portion 281a of the first screen pattern 281 protrudes toward the first subpixel P1 in the second subpixel P2. Accordingly, a part of the first opening area OA1 close to the second subpixel P2 is covered with the first screen pattern 281 and the first power supply line 241 is also covered with the first screen pattern 281. The other part of the first opening area OA1 close to the first subpixel P1 still exposes the first power supply line 241.

Similar to the first opening area OA1, the first screen pattern 281 is provided along the first power supply line 241. Here, the first screen pattern 281 is formed as a plurality of patterns with a predetermined length in the second direction (the Y-axis direction) on the first power supply line 241, but is not limited thereto. The first screen pattern 281 can be formed as a single line pattern extending in the second direction (the Y-axis direction) on the first power supply line 241.

On the other hand, the first screen pattern 281 is formed of the same material in the same layer as the first electrodes 311, 312, and 313, but is not limited thereto.

The second screen pattern 282 is provided between the first subpixel P1 and the second subpixel P2. Particularly, the second screen pattern 282 is provided on the second insulating film 260 which is provided between the first opening area OA1 that exposes a part of the first power supply line 241 and the second opening area OA2 that exposes a part of the second power supply line 242. Here, in the display device 100 according to the third embodiment of the present disclosure, the first screen pattern 281 and the second screen pattern 282 are formed integrally.

The second screen pattern 282 includes a protruding portion 282a that protrudes to cover a part of the second opening area OA2. Here, the protruding portion 282a of the second screen pattern 282 is separated from the second power supply line 242 to form a space between the second power supply line 242 and the second screen pattern 282.

The protruding portion 282a of the second screen pattern 282 protrudes toward the second subpixel P2 in the first subpixel P1. Accordingly, a part of the second opening area OA2 close to the first subpixel P1 is covered with the second screen pattern 282 and the second power supply line 242 is also covered with the second screen pattern 282. The other part of the second opening area OA2 close to the second subpixel P2 still exposes the second power supply line 242.

Similar to the second opening area OA2, the second screen pattern 282 is provided along the second power supply line 242. Here, the second screen pattern 282 is formed as a plurality of patterns with a predetermined length in the second direction (the Y-axis direction) on the second power supply line 242, but is not limited thereto. The second screen pattern 282 can be formed as a single line pattern extending in the second direction (the Y-axis direction) on the second power supply line 242.

On the other hand, the second screen pattern 282 is formed of the same material in the same layer as the first electrodes 311, 312, and 313, but is not limited thereto.

Figure 16:
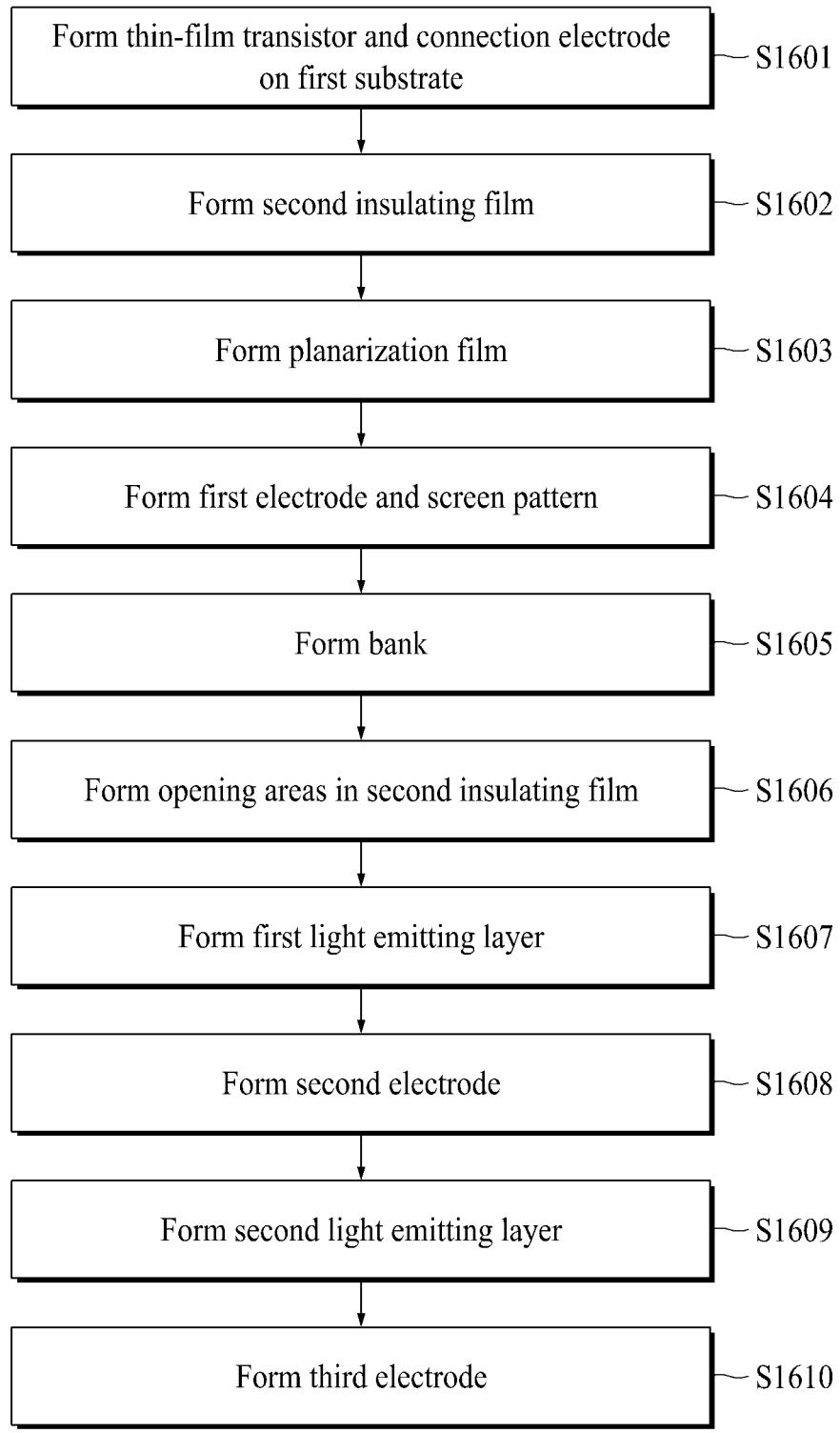
FIG. 16 is a flowchart illustrating a method of manufacturing the display device according to an embodiment of the present disclosure.

FIG. 16 is a flowchart illustrating a method of manufacturing the display device according to the first embodiment of the present disclosure. FIGS. 17A to 17K are sectional views illustrating the method of manufacturing the display device according to the first embodiment of the present disclosure.

Figure 17A:
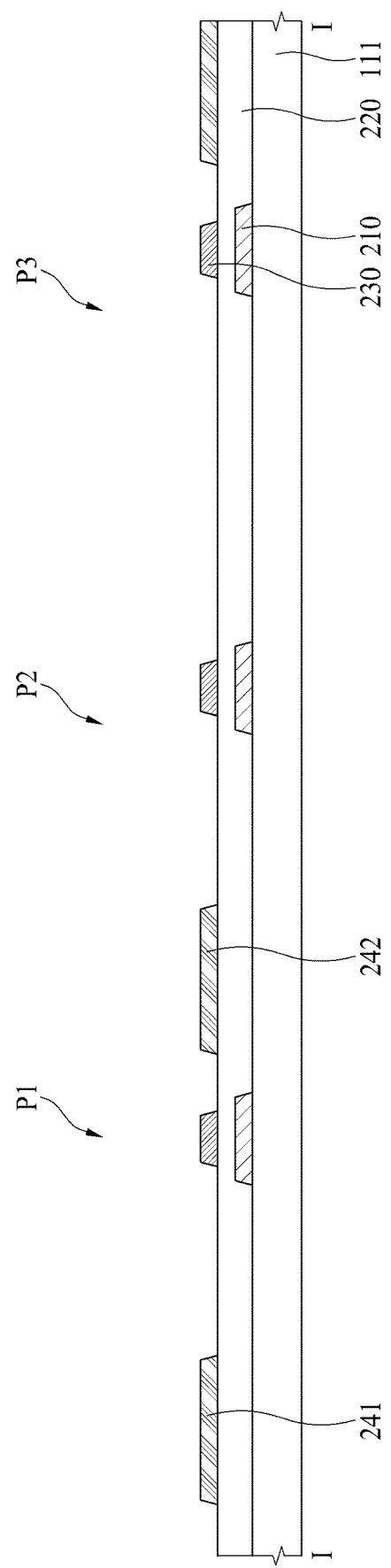
FIGS. 17A to 17K are sectional views illustrating the method of manufacturing the display device according to an embodiment of the present disclosure.

First, as illustrated in FIG. 17A, the thin-film transistor 230 and the connection electrodes 241, 242, and 360 are formed on the first substrate 111 (S1601).

More specifically, the light blocking layer 210 is formed on the first substrate 111. The light blocking layer 210 serves to block external light which is incident on the active layer of the thin-film transistor 230 and thus is formed at a position corresponding to the active layer of the thin-film transistor 230. The light blocking layer 210 can be formed of a conductive material. When the light blocking layer 210 is formed of a conductive material, the auxiliary power supply line 360 can be formed of the same material in the same layer as the light blocking layer 210 on the first substrate 111.

Then, the first insulating film 220 is formed on the light blocking layer 210. The first insulating film 220 may be formed of an inorganic film, such as a silicon oxide film (SiOx), a silicon nitride film (SiNx), or a multi-layered film thereof.

Then, the thin-film transistor 230, the first power supply line 241, the second power supply line 242, and the third electrode 250 are formed on the first insulating film 220.

The active layer is formed on the first insulating film 220. The active layer is formed of a silicon-based semiconductor material or an oxide-based semiconductor material.

The gate insulating film is formed on the active layer. The gate insulating film is formed of an inorganic film, such as a silicon oxide film, a silicon nitride film, or a multi-layered film thereof.

The gate electrode is formed on the gate insulating film. The gate electrode can be a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof, but is not limited thereto.

The interlayer insulating film is formed on the gate electrode. The interlayer insulating film can be formed of an inorganic film, such as a silicon oxide film, a silicon nitride film, or a multi-layered film thereof.

The source electrode and the drain electrode are formed on the interlayer insulating film. The source electrode and the drain electrode are connected to the active layer via a contact hole which penetrates the gate insulating film and the interlayer insulating film. The source electrode and the drain electrode can be a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof, but is not limited thereto.

On the other hand, the first power supply line 241 and the second power supply line 242 are formed of the same material in the same layer as the source electrode and the drain electrode. The first power supply line 241 and the second power supply line 242 are separated from the source electrode and the drain electrode such that they are not electrically connected to the source electrode and the drain electrode.

Figure 17B:
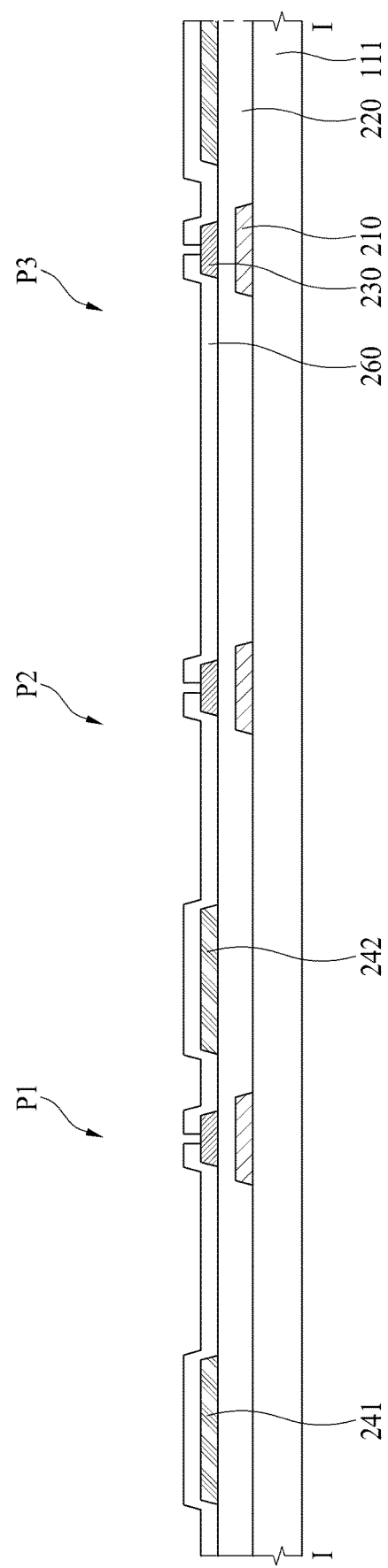

Then, the second insulating film 260 is formed as illustrated in FIG. 17B (S1602).

More specifically, the second insulating film 260 is formed on the thin-film transistor 230 and the connection electrodes 241, 242, and 360.

In the second insulating film 260, contact holes that expose a part of the source electrode or the drain electrode of the thin-film transistor 230 is formed, but the present disclosure is not limited thereto. The contact hole can be formed through a subsequent process.

The second insulating film 260 is formed of an inorganic film, such as a silicon oxide film (SiOx), a silicon nitride film (SiNx), or a multi-layered film thereof, but is not limited thereto.

Figure 17C:
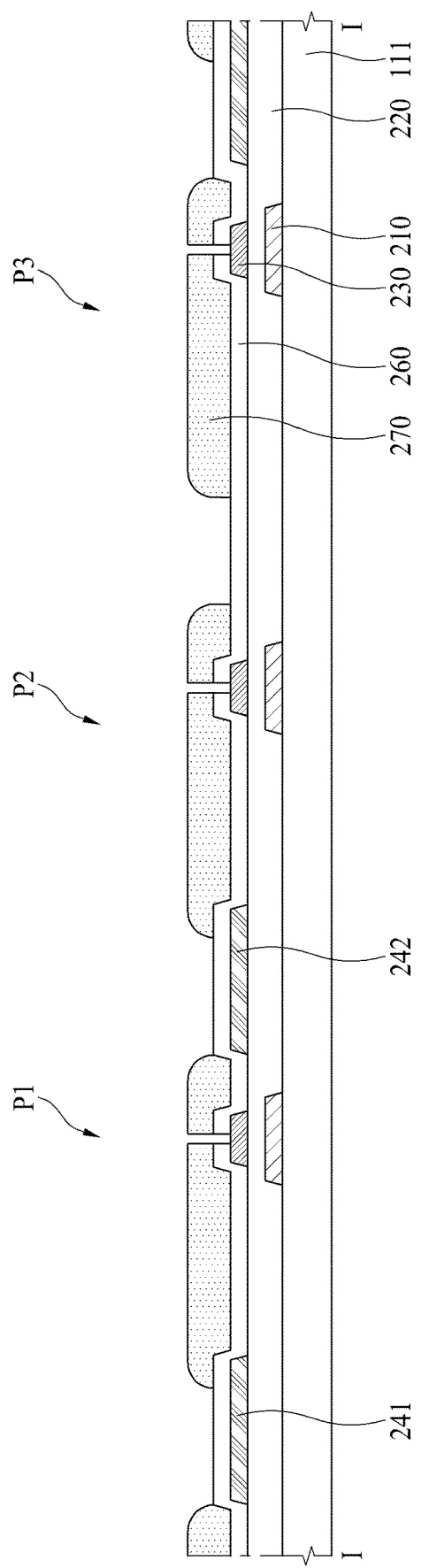

Then, the planarization film 270 is formed as illustrated in FIG. 17C (S1603).

More specifically, the planarization film 270 is formed on the second insulating film 260. The planarization film 270 is formed on the second insulating film 260 to remove a step difference due to the thin-film transistor 230. The planarization film 270 is formed to expose a part of the second insulating film 260 which is disposed in an area in which the first power supply line 241 and the second power supply line 242 are formed. The planarization film 270 is formed to expose a part of the second insulating film 260 which is disposed between the second subpixel P2 and the third subpixel P3.

In the planarization film 270, contact holes that expose a part of the source electrode or the drain electrode of the thin-film transistor 230 is formed, but the present disclosure is not limited thereto. The contact hole can be formed through a subsequent process.

The planarization film 270 is formed of an organic film, such as an acryl resin, an epoxy resin, a phenolic resin, a polyamide resin, or a polyimide resin.

Figure 17D:
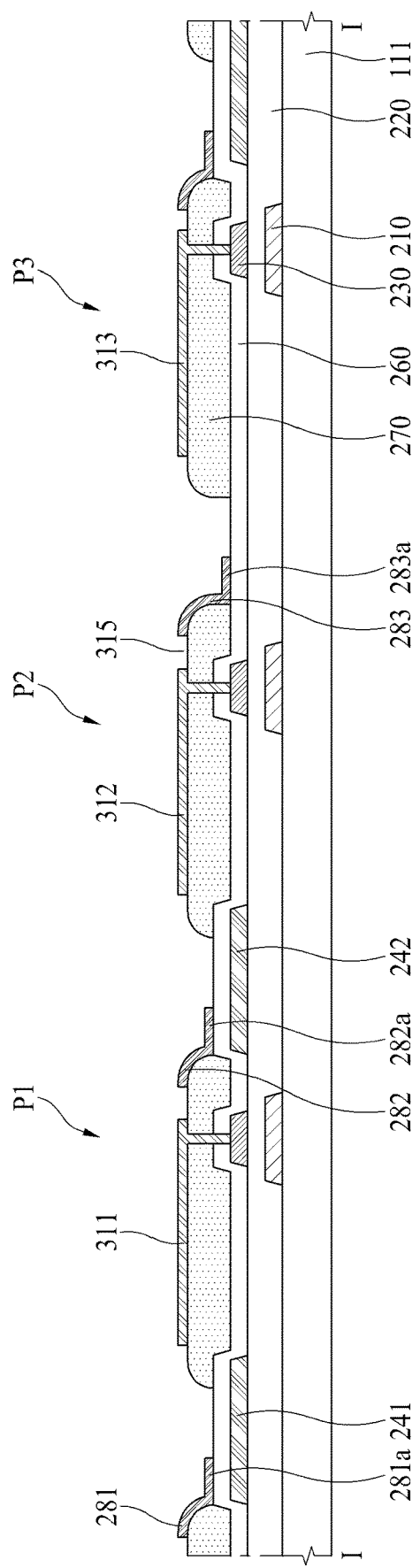

Then, as illustrated in FIG. 17D, the first electrodes 311, 312, and 313 and the screen patterns 281, 282, and 283 are formed (S1604).

More specifically, the first electrodes 311, 312, and 313 are formed on the planarization film 270 in the subpixels P1, P2, and P3. The first electrodes 311, 312, and 313 are connected to the source electrode or the drain electrode of the thin-film transistor 230 via a contact hole.

The first electrodes 311, 312, and 313 are formed of a transparent conductive material (TCO), a semi-transmissive conductive material, or a conductive material having high reflectance. When the display device 100 employs a bottom emission system, the first electrodes 311, 312, and 313 can be formed of a transparent conductive material, such as ITO or IZO that can transmit light or a semi-transmissive conductive material, such as magnesium (Mg), silver (Ag), or an alloy of magnesium (Mg) and silver (Ag). When the display device 100 employs a top emission system, the first electrodes 311, 312, and 313 are formed of a conductive material having high reflectance, such as a stacked structure (Ti/Al/Ti) of aluminum and titanium, a stacked structure (ITO/AU/TO) of aluminum and ITO, an Ag alloy, or a stacked structure (ITO/Ag alloy/ITO) of an Ag alloy and ITO. The Ag alloy can be an alloy of silver (Ag), palladium (Pd), copper (Cu), and the like. The first electrodes 311, 312, and 313 serve as anode electrodes.

The screen patterns 281, 282, and 283 are formed on the planarization film 270 to be separated from the first electrodes 311, 312, and 313. The first electrodes 311, 312, and 313 are also formed on a part of the second insulating film 260 that is not covered with the planarization film 270 but exposed therefrom.

The screen patterns 281, 282, and 283 can be simultaneously formed of the same material as the first electrodes 311, 312, and 313.

Figure 17E:
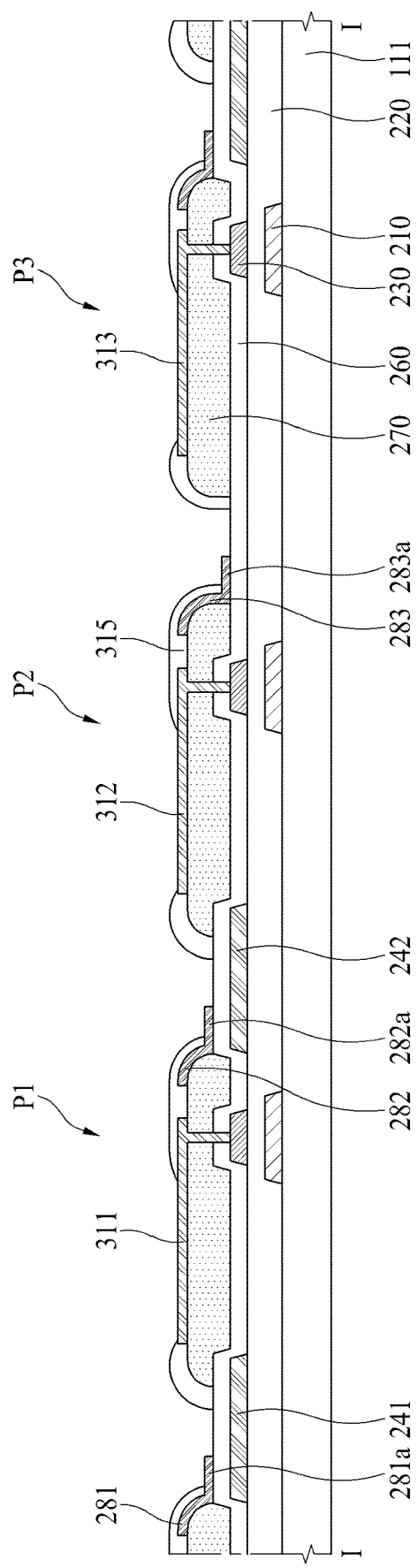

Then, the bank 315 is formed as illustrated in FIG. 17E (S1605).

More specifically, the band 315 is formed to cover ends of the first electrodes 311, 312, and 313. The bank 315 can be formed as a pattern on the planarization film 270 to expose parts of the screen patterns 281, 282, and 283.

Figure 17F:
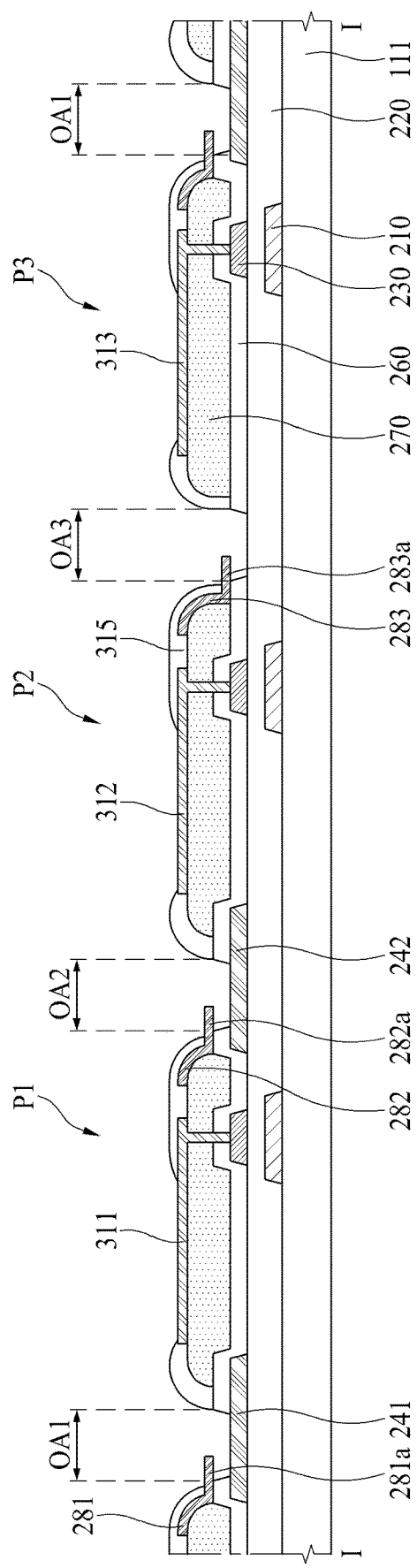

Then, the opening areas OA1, OA2, and OA3 are formed in the second insulating film 260 as illustrated in FIG. 17F (S1606).

More specifically, the opening areas OA1, OA2, and OA3 are formed in the second insulating film 260 by performing an etching process. Here, the etching process can be a wet etching process, and an etchant that can etch the second insulating film 260 but cannot etch the screen patterns 281, 282, and 283 can be used. Accordingly, the screen patterns 281, 282, and 283 are not etched and only the exposed second insulating film 260 is etched to form an undercut structure.

In the second insulating film 260, the first opening area OA1 that exposes a part of the first power supply line 241, the second opening area OA2 that exposes a part of the second power supply line 242, and the third opening area OA3 that exposes a part of the first insulating film 220 are formed through the etching process.

Figure 17G:
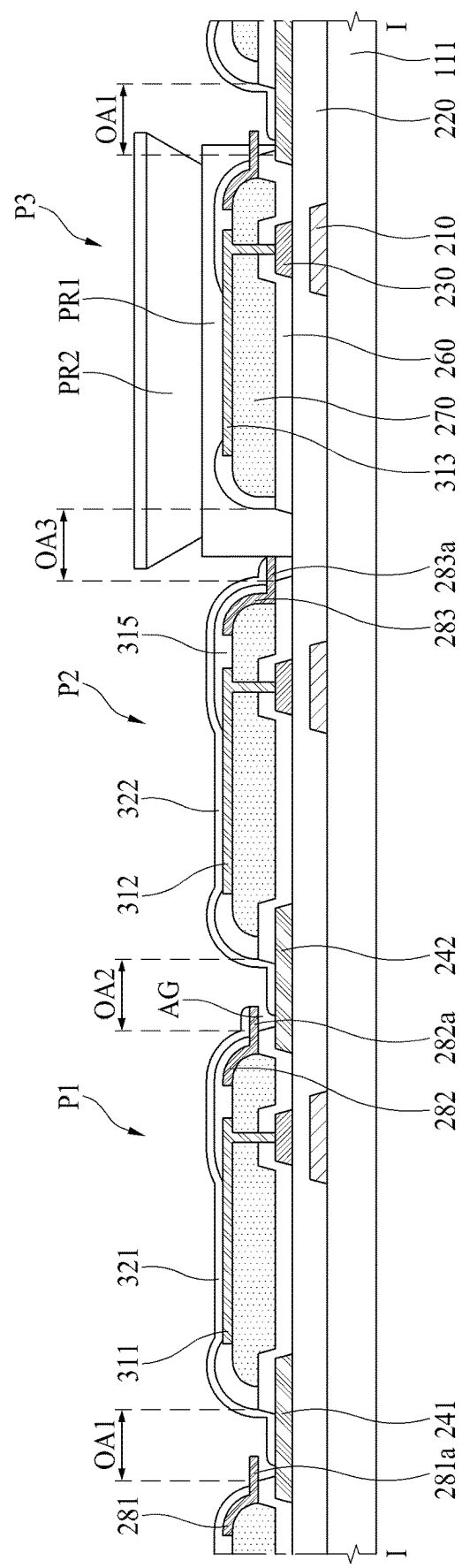

Then, the first light emitting layers 321 and 322 are formed as illustrated in FIG. 17G (S1607).

More specifically, the first light emitting layers 321 and 322 are formed on the first electrodes 311 and 312 and the screen patterns 282 and 283. In the display device 100 according to the third embodiment of the present disclosure, the first light emitting layers 321 and 322 are not formed in the third subpixel P3. For this purpose, a first photoresist pattern PR1 and a second photoresist pattern PR2 are formed in the third subpixel P3. Then, the first light emitting layers 321 and 322 are formed using a deposition process or a solution process. When the first light emitting layers 321 and 322 are formed using the deposition method, an evaporation method can be used.

The first light emitting layers 321 and 322 are cut off between the first subpixel P1 and the second subpixel P2 by the second screen pattern 282. The first light emitting layer 321 of the first subpixel P1 is cut off on the second screen pattern 282. The first light emitting layer 322 of the second subpixel P2 can flow into a space formed under the second screen pattern 282 and can be formed under the second screen pattern 282.

The first light emitting layer 321 of the first subpixel P1 can flow into a space formed under the first screen pattern 281 and can be formed under the first screen pattern 281.

The first light emitting layers 321 and 322 can be one of a red light emitting layer that emits red light, a green light emitting layer that emits green light, a blue light emitting layer that emits blue light, and a yellow light emitting layer that emits yellow light, but are not limited thereto.

Figure 17H:
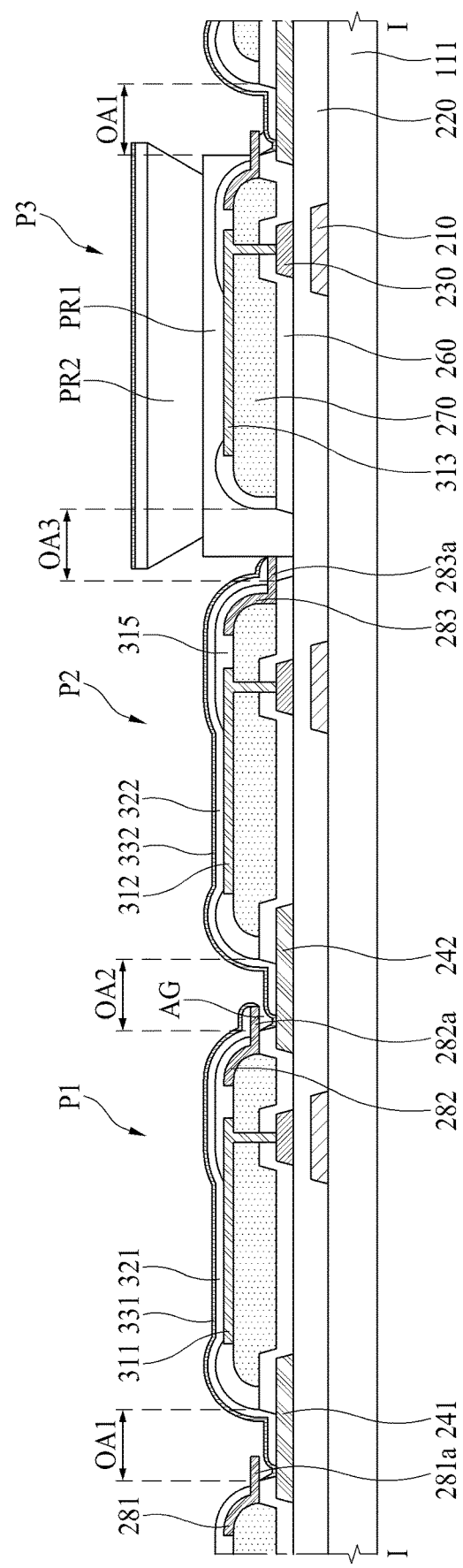
Figure 17I:
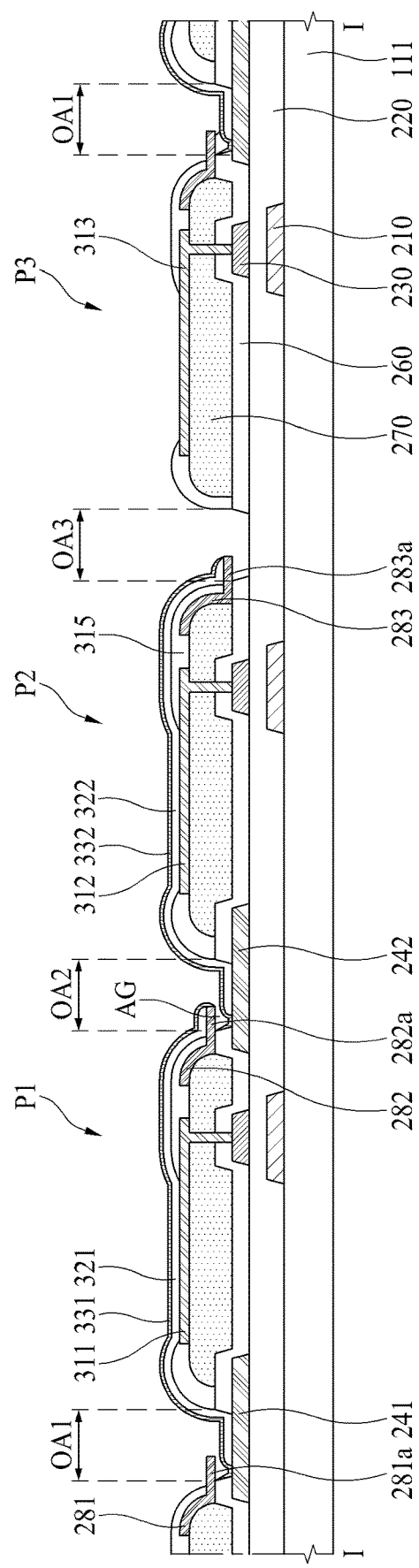

Then, the second electrodes 331 and 332 are formed as illustrated in FIGS. 17H and 17I (S1608).

More specifically, the second electrodes 331 and 332 are formed on the first light emitting layers 321 and 322. In the display device 100 according to the third embodiment of the present disclosure, the second electrodes 331 and 332 are not formed in the third subpixel P3. For this purpose, the second electrodes 331 and 332 are formed in a state in which the first photoresist pattern PR1 and the second photoresist pattern PR2 formed before depositing the first light emitting layers 321 and 322 is not removed as illustrated in FIG. 17H. The second electrodes 331 and 332 can be formed using a physical vapor deposition method, such as a sputtering method. A film which is formed using a physical vapor deposition method, such as a sputtering method is excellent in step coverage characteristics. Accordingly, the second electrodes 331 and 332 can be formed with an area larger than that of the first light emitting layers 321 and 322 which are formed using an evaporation method. Accordingly, the second electrodes 331 and 332 can be connected to one of the first power supply line 241 and the second power supply line 242 under the screen patterns 281 and 282. Then, the first photoresist pattern PR1 and the second photoresist pattern PR2 are removed as illustrated in FIG. 17I.

The second electrodes 331 and 332 are cut off between the first subpixel P1 and the second subpixel P2 by the second screen pattern 282. The second electrode 331 of the first subpixel P1 can be cut off on the second screen pattern 282. The second electrode 332 of the second subpixel P2 can flow into a space formed under the second screen pattern 282 and can be formed under the second screen pattern 282. At this time, the second electrode 332 of the second subpixel P2 is deposited with an area larger than that of the first light emitting layer 322 and is connected to the second power supply line 242.

The second electrode 331 of the first subpixel P1 can flow into a space formed under the first screen pattern 281 and can be formed under the first screen pattern 281. At this time, the second electrode 331 of the first subpixel P1 is deposited with an area larger than that of the first light emitting layer 322 and is connected to the second power supply line 242.

The second electrodes 331 and 332 are formed of a transparent conductive material (TCO), such as ITO or IZO that can transmit light or a semi-transmissive conductive material, such as magnesium (Mg), silver (Ag), or an alloy of magnesium (Mg) and silver (Ag).

Figure 17J:
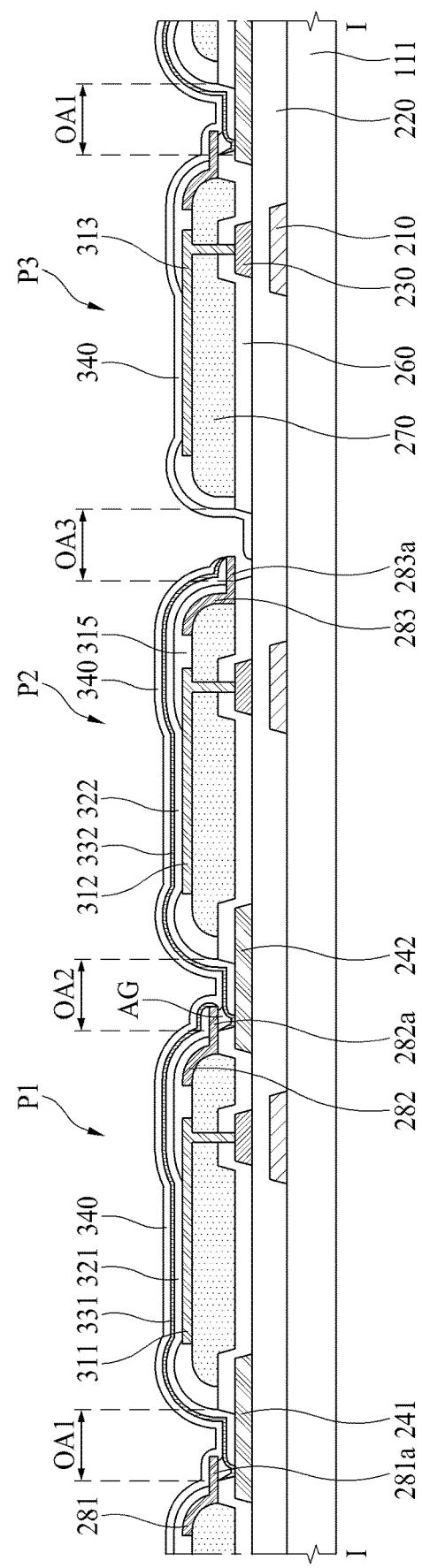

Then, the second light emitting layer 340 is formed as illustrated in FIG. 17J (S1609).

More specifically, the second light emitting layer 340 is formed on the second electrode 331 of the first subpixel P1, the second electrode 332 of the second subpixel P2, and the first electrode 313 of the third subpixel P3. The second light emitting layer 340 is formed using a deposition process or a solution process. When the second light emitting layer 340 is formed using the deposition method, an evaporation method can be used.

The second light emitting layer 340 is connected between the first subpixel P1 and the second subpixel P2 and between the third subpixel P3 and the first subpixel P1. The second light emitting layer 340 can be formed while partially filling a space between the screen patterns 281 and 282. Here, an air gap AG is formed in a space which is not filled with the second light emitting layer 340 between the screen patterns 281 and 282 and the second electrodes 331 and 332.

On the other hand, the second light emitting layer 340 can be cut off between the second subpixel P2 and the third subpixel P3 due to a large step difference between third screen pattern 283 and the first insulating film 220. The second light emitting layer 340 of the third subpixel P3 flows into a space between the protruding portion 283a of the third screen pattern 283 and the first insulating film 220 and is formed under the protruding portion 283a of the third screen pattern 283. For example, the second light emitting layer 340 extends across the gap between the first subpixel P1 and the second subpixel P2, but the second light emitting layer is disconnected in a region between the second subpixel P2 and the third subpixel P3.

The second light emitting layer 340 can be one of a red light emitting layer that emits red light, a green light emitting layer that emits green light, a blue light emitting layer that emits blue light, and a yellow light emitting layer that emits yellow light, but are not limited thereto.

Here, the second light emitting layer 340 can emit light of a color which is different from that of the first light emitting layers 321 and 322. When the first light emitting layers 321 and 322 are a light emitting layer that emits light of a first color, the second light emitting layer 340 can be a light emitting layer that emits light of a second color which is different from the first color. For example, the first light emitting layers 321 and 322 can be a yellow light emitting layer that emits yellow light and the second light emitting layer 340 can be a blue light emitting layer that emits blue light.

Figure 17K:
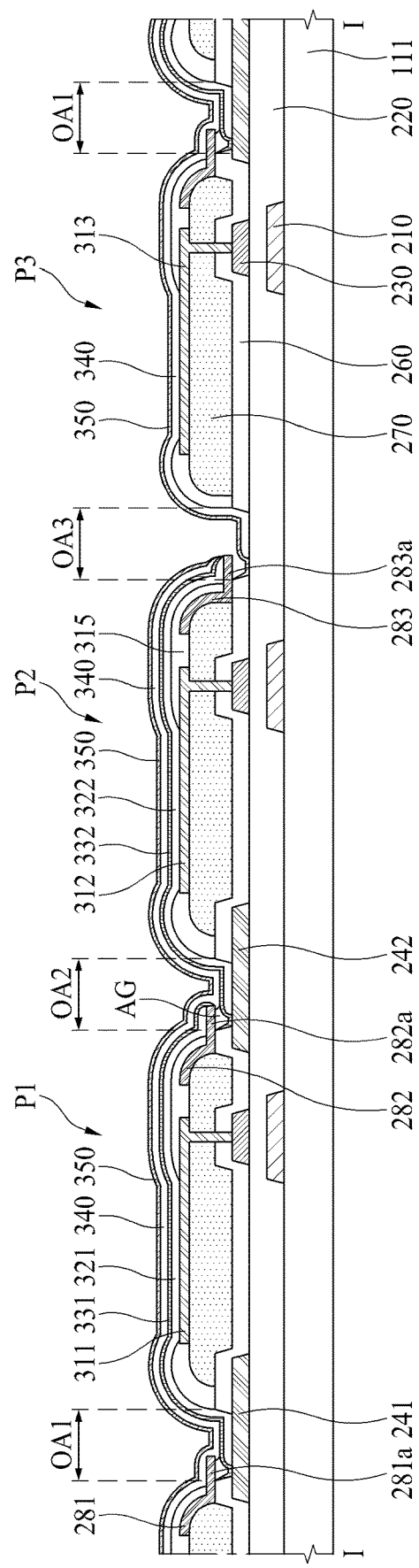

Then, the third electrode 350 is formed as illustrated in FIG. 17K (S1610).

More specifically, the third electrode 350 is formed on the second light emitting layer 340. The third electrode 350 can be formed using a physical vapor deposition method, such as a sputtering method. Alternatively, the third electrode 350 can be formed using an evaporation method.

The third electrode 350 is connected between the first subpixel P1 and the second subpixel P2 and between the third subpixel P3 and the first subpixel P1.

On the other hand, the third electrode 350 is cut off between the second subpixel P2 and the third subpixel P3 due to a large step difference between the third screen pattern 283 and the first insulating film 220. The third electrode 350 of the third subpixel P3 flows into a space between the protruding portion 283a of the third screen pattern 283 and the second light emitting layer 340 and is formed under the protruding portion 283a of the third screen pattern 283.

The third electrode 350 is formed of a transparent conductive material, a semi-transmissive conductive material, or a conductive material having high reflectance. When the display device 100 employs a bottom emission system, the third electrode 350 can be formed of a conductive material having high reflectance, such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy can be an alloy of silver (Ag), palladium (Pd), copper (Cu), and the like. When the display device 100 employs a top emission system, the third electrode 350 can be formed of a transparent conductive material (TCO), such as ITO or IZO that can transmit light or a semi-transmissive conductive material, such as magnesium (Mg), silver (Ag), or an alloy of magnesium (Mg) and silver (Ag). The third electrode 350 can serve as a cathode electrode.

Figure 18A:
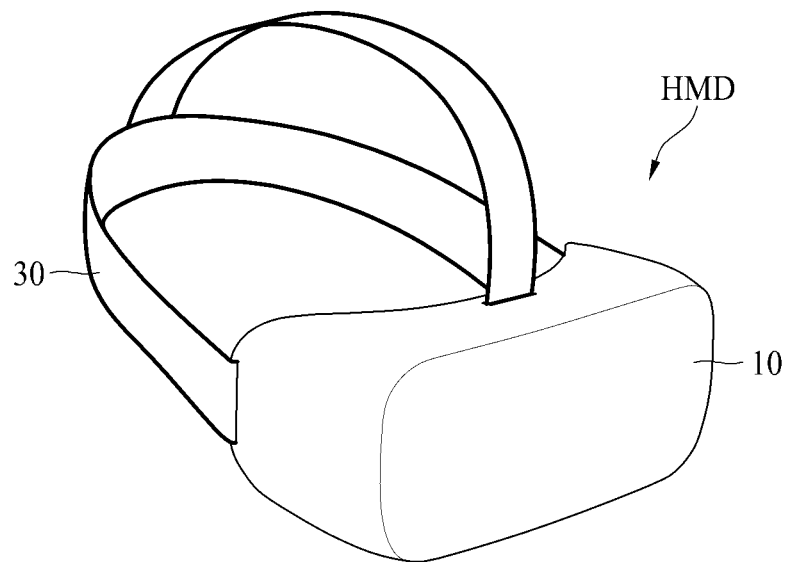
FIGS. 18A to 18C are diagrams illustrating a head-mounted display (HMD) device according to another embodiment of the present disclosure.
Figure 18B:
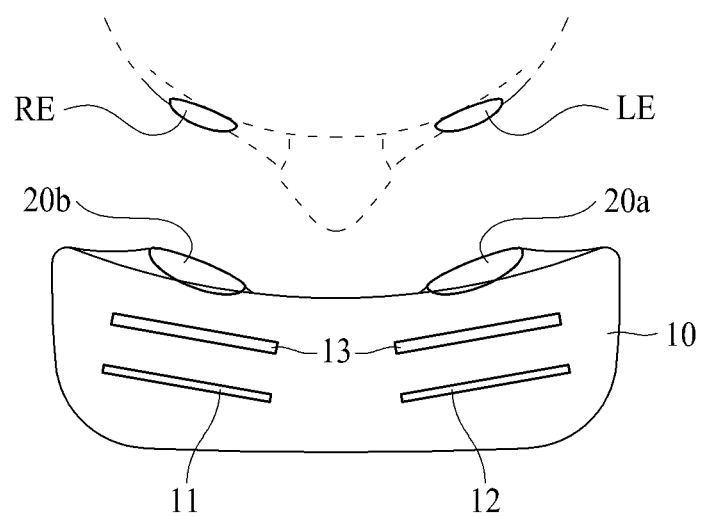
Figure 18C:
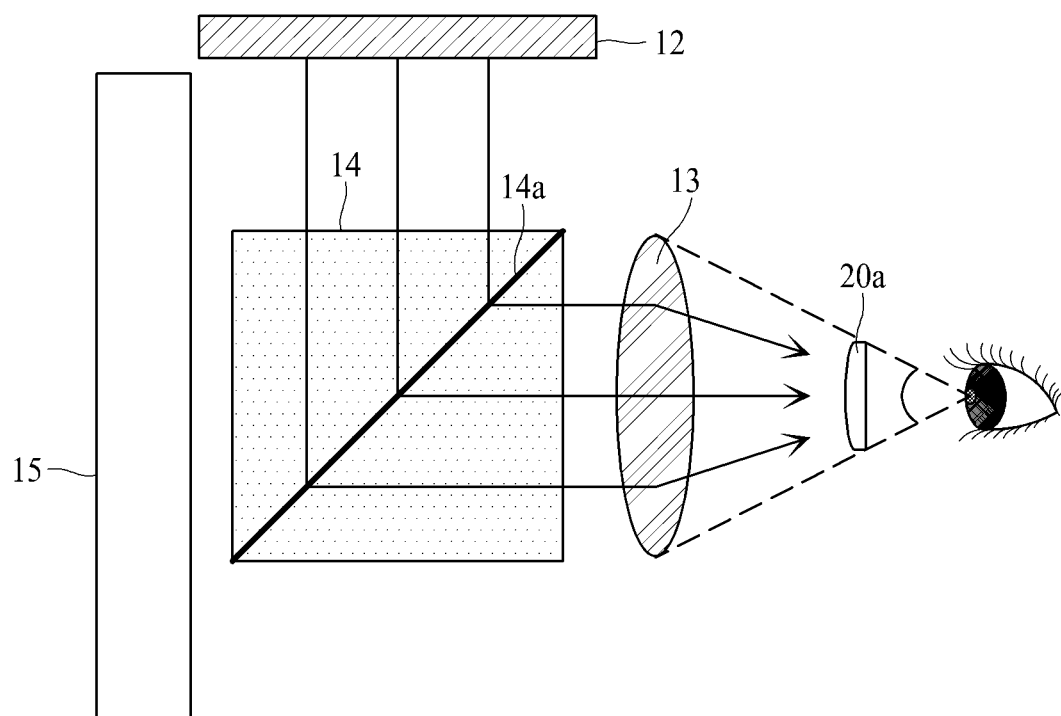

FIGS. 18A to 18C are diagrams illustrating a head-mounted display (HMD) device which is a display device according to another embodiment of the present disclosure. FIG. 18A is a schematic perspective view, FIG. 18B is a schematic plan view of a virtual reality (VR) structure, and FIG. 18C is a schematic sectional view of an augmented reality (AR) reality.

As can be seen from FIG. 18A, the head-mounted display device according to the present disclosure includes a storage case 10 and a head-mounted band 30.

The storage case 10 stores elements, such as a display device, a lens array, and an eyepiece therein.

The head-mounted band 30 is fixed to the storage case 10. The head-mounted band 30 is formed to surround the top and both side surfaces of a user's head, but is not limited thereto. The head-mounted band 30 is used to fix the head-mounted display device to a user's head and can be replaced with an eyeglass-shaped structure or a helmet-shaped structure.

As can be seen from FIG. 18B, the head-mounted display device for virtual reality (VR) according to the present disclosure includes a left-eye display device 12, a right-eye display device 11, a lens arrays 13, a left-eye eyepiece 20a, and a right-eye eyepiece 20b.

The left-eye display device 12, the right-eye display device 11, the lens arrays 13, the left-eye eyepiece 20a, and the right-eye eyepiece 20b are stored in the storage case 10.

The left-eye display device 12 and the right-eye display device 11 can display the same image. In this situation, a user can watch a 2D image. Alternatively, the left-eye display device 12 can display a left-eye image and the right-eye display device 11 can display a right-eye image. In this situation, a user can watch a 3D image. Each of the left-eye display device 12 and the right-eye display device 11 can employ the display devices illustrated I FIGS. 1 to 15. Here, an upper part corresponding to the surface on which an image is displayed, for example, a color filter layer 160, in FIGS. 1 to 15 faces the lens array 13.

The lens array 13 can be separated from the left-eye eyepiece 20a and the left-eye display device 12 and be disposed between the left-eye eyepiece 20a and the left-eye display device 12. That is, the lens array 13 can be disposed before the left-eye eyepiece 20a and after the left-eye display device 12. The lens array 13 can be separated from the right-eye eyepiece 20b and the right-eye display device 11 and be disposed between the right-eye eyepiece 20b and the right-eye display device 11. That is, the lens array 13 can be disposed before the right-eye eyepiece 20b and after the right-eye display device 11.

The lens arrays 13 can be microlens arrays. The lens arrays 13 can be replaced with a pin-hole array. An image which is displayed on the left-eye display device 12 or the right-eye display device 11 can be enlarged for a user by the lens arrays 13.

A user's left eye LE is located at the left-eye eyepiece 20a and the user's right eye RE is located at the right-eye eyepiece 20b.

As can be seen from FIG. 18C, the head-mounted display device for augmented reality (AR) according to the present disclosure includes a left-eye display device 12, a right-eye display device 11, a left-eye eyepiece 20a, a transmissive/reflective portion 14, and a transmission window 15. For the purpose of convenience, only a configuration on the left-eye side is illustrated in FIG. 18C, but a configuration on the right-eye side is the same as the configuration on the left-eye side.

The left-eye display device 12, the lens array 13, the left-eye eyepiece 20a, the transmissive/reflective portion 14, and the transmission window 15 are stored in the storage case 10.

The left-eye display device 12 can be disposed on one side of the transmissive/reflective portion 14, that is, an upper side, such that the transmission window 15 is not covered. Accordingly, the left-eye display device 12 can provide an image to the transmissive/reflective portion 14 while not covering the background through the transmission window 15.

The left-eye display device 12 can employ the display devices illustrated in FIGS. 1 to 15. Here, an upper part corresponding to the surface on which an image is displayed in FIGS. 1 to 15, for example, the color filter (not illustrated), faces the transmissive/reflective portion 14.

The lens array 13 is disposed between the left-eye eyepiece 20a and the transmissive/reflective portion 14.

A user's left eye is located at the left-eye eyepiece 20a.

The transmissive/reflective portion 14 is disposed between the lens array 13 and the transmission window 15. The transmissive/reflective portion 14 includes a reflective surface 14a that transmits some light and reflects other light. The reflective surface 14a is formed such that an image displayed on the left-eye display device 12 propagates to the lens array 13. Accordingly, a user can watch both an external background and an image which is displayed by the left-eye display device 12 through the transmission window 15. That is, a user can watch a single image in which a real background and a virtual image are superimposed and thus augmented reality (AR) can be realized.

The transmission window 15 is disposed before the transmissive/reflective portion 14.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. A display device comprising:
   a first subpixel and a second subpixel disposed on a substrate;
   a first electrode disposed in each of the first subpixel and the second subpixel;
   a first light emitting layer disposed on the first electrode, the first light emitting layer configured to emit light of a first color;
   a second electrode disposed on the first light emitting layer;
   a second light emitting layer disposed on the second electrode, the second light emitting layer configured to emit light of a second color; and
   a third electrode disposed on the second light emitting layer,
   wherein the first light emitting layer and the second electrode are both included in the first subpixel, and the first light emitting layer and the second electrode are both absent from the second subpixel.

2. The display device according to claim 1, wherein the second electrode of the first subpixel is electrically connected to the third electrode.

3. The display device according to claim 1, wherein the first light emitting layer of the first subpixel emits light based on different voltages supplied to the first electrode and the second electrode, and
   wherein the second light emitting layer of the second subpixel emits light based on different voltages supplied to the first electrode and the third electrode.

4. The display device according to claim 1, wherein the second light emitting layer is included in both the first subpixel and the second subpixel, and
   wherein the second light emitting layer in the first subpixel is spaced apart from and electrically isolated from the second light emitting layer in the second subpixel.

5. The display device according to claim 1, wherein the third electrode is included in both the first subpixel and the second subpixel, and
   wherein the third electrode in the first subpixel is spaced apart from and electrically isolated from the third electrode in the second subpixel.

6. The display device according to claim 2, further comprising:
   a first power supply line electrically connected to the second electrode of the first subpixel; and
   an auxiliary power supply line electrically connected to the first power supply line and the third electrode of the first subpixel.

7. The display device according to claim 6, wherein the substrate includes a display area in which the first subpixel and the second subpixel are disposed, and a non-display area surrounding the display area,
   wherein the auxiliary power supply line is disposed in the non-display area,
   wherein the first power supply line is disposed in the display area, electrically connected to the second electrode of the first subpixel and extends from the display area to the auxiliary power supply line disposed in the non-display area, and
   wherein and an end of the first power supply line is electrically connected to the auxiliary power supply line.

8. The display device according to claim 6, further comprising:
- a driving transistor disposed in each of the first subpixel and the second subpixel, the driving transistor including an active layer, a gate electrode, a source electrode, and a drain electrode,
- wherein the first power supply line is formed in a same layer as one of the active layer, the gate electrode, the source electrode, and the drain electrode.

9. The display device according to claim 8, further comprising:
- a first insulating film disposed on the driving transistor and the first power supply line, the first insulating film including a first opening area for exposing a part of the first power supply line,
- wherein the second electrode of the first subpixel is connected to the first power supply line in the first opening area.

10. The display device according to claim 9, further comprising:
- a first screen pattern disposed on the first insulating film, the first screen pattern including a protruding portion covering a part of the first opening area in the first insulating film.

11. The display device according to claim 10, wherein the second electrode of the first subpixel is connected to the first power supply line in a region under the protruding portion of the first screen pattern.

12. The display device according to claim 6, further comprising:
- a second power supply line electrically connected to the third electrode of the second subpixel.

13. The display device according to claim 12, wherein the substrate includes a display area in which the first subpixel and the second subpixel are disposed, and a non-display area surrounding the display area,
- wherein the auxiliary power supply line is disposed in the non-display area,
- wherein the second power supply line is disposed in the display area, electrically connected to the third electrode of the second subpixel and extends from the display area to the auxiliary power supply line disposed in the non-display area, and
- wherein an end of the second power supply line is electrically connected to the auxiliary power supply line.

14. A display device comprising:
- a first subpixel, a second subpixel and a third subpixel disposed on a substrate;
- a first electrode disposed in each of the first subpixel, the second subpixel and the third subpixel;
- a first light emitting layer disposed on the first electrode, the first light emitting layer configured to emit light of a first color;
- a second electrode disposed on the first light emitting layer;
- a second light emitting layer disposed on the second electrode, the second light emitting layer configured to emit light of a second color; and
- a third electrode disposed on the second light emitting layer,
- wherein the first light emitting layer and the second electrode are both included in the first subpixel and the third subpixel, and the first light emitting layer and the second electrode are both absent from the second subpixel.

15. The display device according to claim 14, wherein the first subpixel is a red subpixel, the second subpixel is a blue subpixel, and the third subpixel is a green subpixel.

16. The display device according to claim 14, wherein the second electrode and the third electrode in the first subpixel and the third subpixel are electrically connected to each other and configured to receive a same voltage, and
- wherein the first electrode and the second electrode are configured to receive different voltages.

17. The display device according to claim 14, wherein the first light emitting layer and the second electrode are spaced apart and electrically isolated from each other between the first subpixel and the third subpixel, and
- wherein the second light emitting layer is connected between the first subpixel and the third subpixel and extends across a gap between the first and third subpixels.

18. The display device according to claim 14, further comprising:
- a first power supply line electrically connected to the second electrode of the first subpixel;
- a third power supply line electrically connected to the second electrode of the third subpixel; and
- an auxiliary power supply line electrically connected to the first power supply line, the third power supply line and the third electrode.

19. The display device according to claim 18, wherein the substrate includes a display area in which the first subpixel, the second subpixel, and the third subpixel are disposed, and a non-display area surrounding the display area,
- wherein the auxiliary power supply line is disposed in the non-display area,
- wherein the first power supply line is disposed in the display area, electrically connected to the second electrode of the first subpixel, and extends from the display area to the auxiliary power supply line disposed in the non-display area,
- wherein an end of the first power supply line is electrically connected to the auxiliary power supply line,
- wherein the third power supply line is parallel to the first power supply line in the display area, electrically connected to the second electrode of the third subpixel, and extends from the display area to the auxiliary power supply line disposed in the non-display area, and
- wherein an end of the third power supply line is electrically connected to the auxiliary power supply line.

20. The display device according to claim 18, wherein the first power supply line and the third power supply line are separated from each other, and
- wherein the first subpixel or the third subpixel is disposed between the first power supply line and the third power supply line.

21. The display device according to claim 18, wherein the first power supply line and the third power supply line are disposed between the first subpixel and the third subpixel and the first and third power supply lines are formed integrally with each other.

* * * * *